US010333521B2

(12) United States Patent
Okamoto

(10) Patent No.: US 10,333,521 B2
(45) Date of Patent: Jun. 25, 2019

(54) SEMICONDUCTOR DEVICE

(71) Applicant: Semiconductor Energy Laboratory Co., Ltd., Atsugi-shi, Kanagawa-ken (JP)

(72) Inventor: Yuki Okamoto, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 73 days.

(21) Appl. No.: 15/589,034

(22) Filed: May 8, 2017

(65) Prior Publication Data
US 2017/0331479 A1 Nov. 16, 2017

(30) Foreign Application Priority Data

May 13, 2016 (JP) ................. 2016-096700

(51) Int. Cl.
| H03K 19/0185 | (2006.01) |
| H03K 3/03 | (2006.01) |
| H03K 5/159 | (2006.01) |
| H03K 19/0175 | (2006.01) |
| H01L 23/498 | (2006.01) |
| H03L 7/089 | (2006.01) |
| H03L 7/099 | (2006.01) |

(52) U.S. Cl.
CPC ... *H03K 19/018507* (2013.01); *H03K 3/0315* (2013.01); *H03K 5/159* (2013.01); *H03K 19/017581* (2013.01); *H01L 23/49838* (2013.01); *H03L 7/0891* (2013.01); *H03L 7/0995* (2013.01)

(58) Field of Classification Search
CPC .................. H03K 19/018507; H03K 19/0175
See application file for complete search history.

(56) References Cited

U.S. PATENT DOCUMENTS

| 4,547,749 A | 10/1985 | Kuo |
| 5,012,142 A | 4/1991 | Sonntag et al. |
| 5,594,391 A | 1/1997 | Yoshizawa |
| 5,596,545 A | 1/1997 | Lin |

(Continued)

FOREIGN PATENT DOCUMENTS

| JP | 10-242811 A | 9/1998 |
| JP | 2000-114934 A | 4/2000 |

OTHER PUBLICATIONS

Gao.X et al., "Jitter Analysis and a Benchmarking Figure-of-Merit for Phase-Locked Loops", IEEE Transactions on Circuits and Systems, Feb. 1, 2009, vol. 56, No. 2, pp. 117-121.

(Continued)

*Primary Examiner* — Hai L Nguyen
(74) *Attorney, Agent, or Firm* — Fish & Richardson P.C.

(57) ABSTRACT

A voltage-controlled oscillator is provided. A semiconductor device includes a first circuit and a second circuit. The first circuit has a function of holding a first potential and a function of controlling the level of a third potential supplied to the second circuit according to a second potential based on the first potential. The second circuit has a function of outputting a second signal based on a first signal input to the second circuit. The delay time from input of the first signal to the second circuit to output of the second signal from the second circuit is determined by the third potential.

14 Claims, 33 Drawing Sheets

(56) References Cited

U.S. PATENT DOCUMENTS

| | | | |
|---|---|---|---|
| 5,805,012 A * | 9/1998 | Jeon | H03K 19/00384 327/285 |
| 6,771,202 B2 | 8/2004 | Watanabe et al. | |
| 7,504,854 B1 | 3/2009 | Look et al. | |
| 7,549,139 B1 | 6/2009 | Tuan et al. | |
| 7,800,455 B2 | 9/2010 | Koyama et al. | |
| 8,729,938 B2 | 5/2014 | Watanabe | |
| 8,921,853 B2 | 12/2014 | Yamazaki | |
| 9,479,145 B2 | 10/2016 | Okamoto et al. | |
| 9,793,905 B2 | 10/2017 | Okamoto et al. | |
| 2003/0201927 A1 | 10/2003 | Watanabe et al. | |
| 2011/0114942 A1 | 5/2011 | Akimoto et al. | |
| 2011/0133796 A1 | 6/2011 | Osada | |
| 2012/0293223 A1 | 11/2012 | Watanabe | |
| 2014/0340073 A1 | 11/2014 | Okamoto et al. | |
| 2015/0137120 A1 | 5/2015 | Yamazaki | |
| 2015/0221285 A1 | 8/2015 | Song et al. | |
| 2015/0256161 A1 | 9/2015 | Okamoto et al. | |
| 2016/0028347 A1 | 1/2016 | Okamoto et al. | |
| 2016/0042787 A1 | 2/2016 | Brooks | |
| 2016/0043715 A1 | 2/2016 | Kurokawa et al. | |
| 2016/0117045 A1 | 4/2016 | Yamazaki et al. | |
| 2016/0126888 A1 | 5/2016 | Okamoto et al. | |
| 2016/0254819 A1 | 9/2016 | Okamoto et al. | |
| 2017/0019117 A1 | 1/2017 | Okamoto et al. | |

OTHER PUBLICATIONS

Anand.S et al., "A CMOS Clock Recovery Circuit for 2.5-Gb/s NRZ Data", IEEE Journal of Solid-State Circuits, Mar. 1, 2001, vol. 36, No. 3, pp. 432-439.

Zhai.C et al., "An N-path Filter Enhanced Low Phase Noise Ring VCO", 2014 Symposium on VLSI Circuits Digest of Technical Papers, Jun. 10, 2014, pp. 187-188.

* cited by examiner

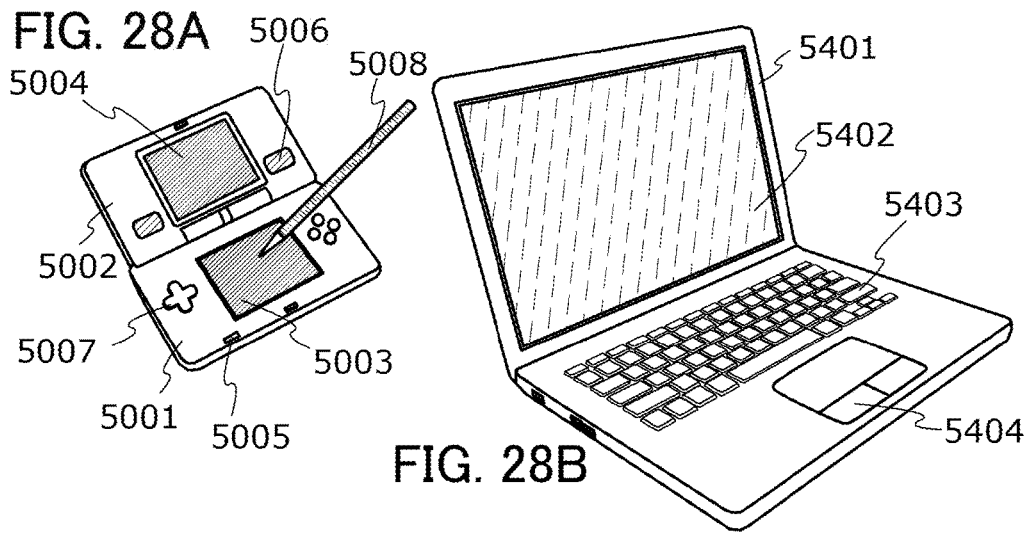
FIG. 28A
FIG. 28B
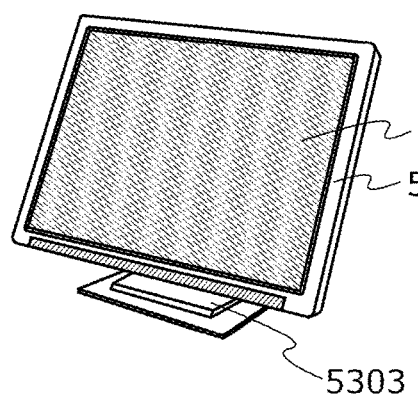
FIG. 28C
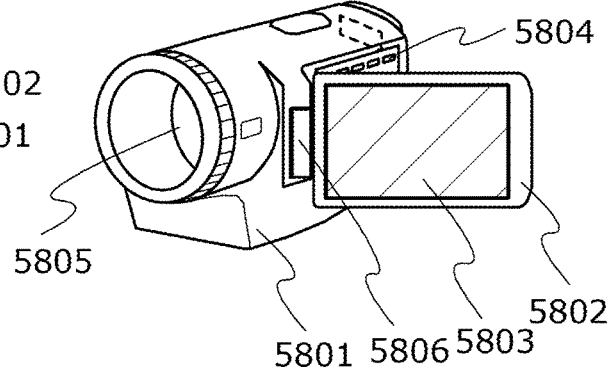
FIG. 28D
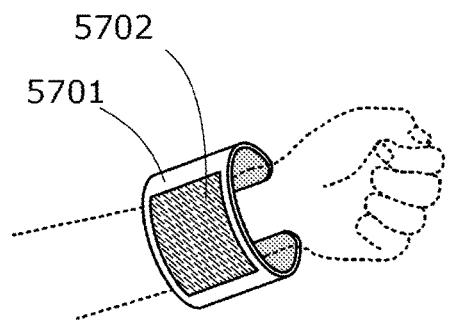
FIG. 28E
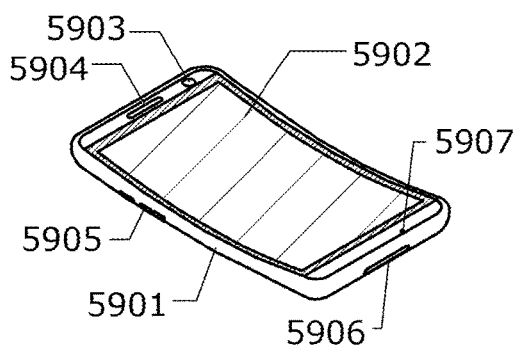
FIG. 28F

30

SEMICONDUCTOR DEVICE

BACKGROUND OF THE INVENTION

1. Field Of The Invention

One embodiment of the present invention relates to an oscillator circuit such as a voltage-controlled oscillator. Furthermore, one embodiment of the present invention relates to a semiconductor device such as a voltage-controlled oscillator.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

2Description of the Related Art

A voltage-controlled oscillator (VCO) has a function of controlling oscillation frequency of an output signal according to a potential of an input signal, and is used for a phase-locked loop (PLL), a DC-DC converter, or the like. A ring oscillator based voltage-controlled oscillator, which makes an output signal oscillate by utilizing a signal delay time in a circuit, has an advantage of being able to have a layout area smaller than a voltage-controlled oscillator using an LC resonance circuit.

The following Patent Document 1 discloses a voltage-controlled oscillator in which output oscillation frequency is changed by a voltage applied to an input terminal. The following Patent Document 2 discloses a voltage-controlled oscillator that includes a plurality of transfer gates for adjusting delay time in a ring oscillator circuit forming a VCO and adjusts the delay time in the ring oscillator circuit by switching between the transfer gates.

REFERENCE

Patent Document

[Patent Document 1] Japanese Published Patent Application No. 2000-114934
[Patent Document 2] Japanese Published Patent Application No. H10-242811

SUMMARY OF THE INVENTION

In general, a ring oscillator based voltage-controlled oscillator tends to consume more power than a voltage-controlled oscillator using an LC resonance circuit. Reduction in the power consumption is an important object. The layout area of a ring oscillator based voltage-controlled oscillator is desirably reduced for high performance and miniaturization of an integrated circuit including a voltage-controlled oscillator.

In view of the technical background, an object of one embodiment of the present invention is to provide a voltage-controlled oscillator which can have a small layout area. Another object of one embodiment of the present invention is to provide a voltage-controlled oscillator that can achieve reduction in power consumption. Another object of one embodiment of the present invention is to provide a semiconductor device, such as a voltage-controlled oscillator, which can have a small layout area. Another object of one embodiment of the present invention is to provide a semiconductor device, such as a voltage-controlled oscillator which can achieve reduction in power consumption.

Note that it is an object of one embodiment of the present invention to provide a novel semiconductor device or the like. Note that the description of these objects does not disturb the existence of other objects. In one embodiment of the present invention, there is no need to achieve all the objects. Other objects will be apparent from and can be derived from the description of the specification, the drawings, the claims, and the like.

A semiconductor device of one embodiment of the present invention includes a first circuit and a second circuit. The first circuit has a function of holding a first potential and a function of controlling the level of a third potential supplied to the second circuit according to a second potential based on the first potential. The second circuit has a function of outputting a second signal based on a first signal input to the second circuit. A delay time from input of the first signal to the second circuit to output of the second signal from the second circuit is determined by the third potential.

A semiconductor device of one embodiment of the present invention includes a first circuit and a second circuit. The first circuit comprises a transistor. The first circuit is has a function of holding a first potential and a function of supplying a second potential based on the first potential to a gate of the transistor. The second circuit has a function of outputting a second signal based on a first signal input to the second circuit. The transistor has a function of delaying the second signal. A delay time of the second signal is determined by the second potential.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit, and a chip including an integrated circuit are semiconductor devices. Moreover, a memory device, a display device, a light-emitting device, a lighting device, an electronic device, and the like themselves might be semiconductor devices, or might each include a semiconductor device.

Furthermore, in this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or texts, another connection relation is included in the drawings or the texts. Here, X and Y each denote an object (e.g., a device, an element, a circuit, a wiring, an electrode, a terminal, a conductive film, or a layer).

Note that a transistor includes three terminals: a gate, a source, and a drain. A gate is a node that controls the conduction state of a transistor. Depending on the channel type of the transistor or levels of potentials applied to the terminals, one of two input/output nodes functions as a source and the other functions as a drain. Therefore, the terms "source" and "drain" can be switched in this specification and the like. In this specification and the like, the two terminals other than the gate may be referred to as a first terminal and a second terminal.

A node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In many cases, a voltage refers to a potential difference between a certain potential and a reference potential (e.g., a ground potential (GND) or a source potential). Thus, a voltage can be referred to as a potential and vice versa. Note that the potential indicates a relative value. Accordingly, "ground potential" does not necessarily mean 0 V.

In this specification and the like, the terms "film" and "layer" can be interchanged depending on the case or circumstances. For example, in some cases, the term "conductive layer" can be changed into the term "conductive film," and the term "insulating film" can be changed into the term "insulating layer."

In this specification and the like, ordinal numbers such as first, second, and third are used to avoid confusion among components, and the terms do not limit the components numerically or do not limit the order.

According to one embodiment of the present invention, a voltage-controlled oscillator which can have a small layout area can be provided owing to the above structure. According to one embodiment of the present invention, a voltage-controlled oscillator that can achieve reduction in power consumption can be provided owing to the above structure. According to one embodiment of the present invention, a semiconductor device, such as a voltage-controlled oscillator, which can have a small layout area can be provided owing to the above structure. According to one embodiment of the present invention, a semiconductor device, such as a voltage-controlled oscillator which can achieve reduction in power consumption, can be provided owing to the above structure. According to one embodiment of the present invention, a novel semiconductor device can be provided owing to the above structure.

Note that one embodiment of the present invention can provide a novel semiconductor device or the like. Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 28A to 28F each illustrate an electronic device.

DETAILED DESCRIPTION OF THE INVENTION

Figure 1A:
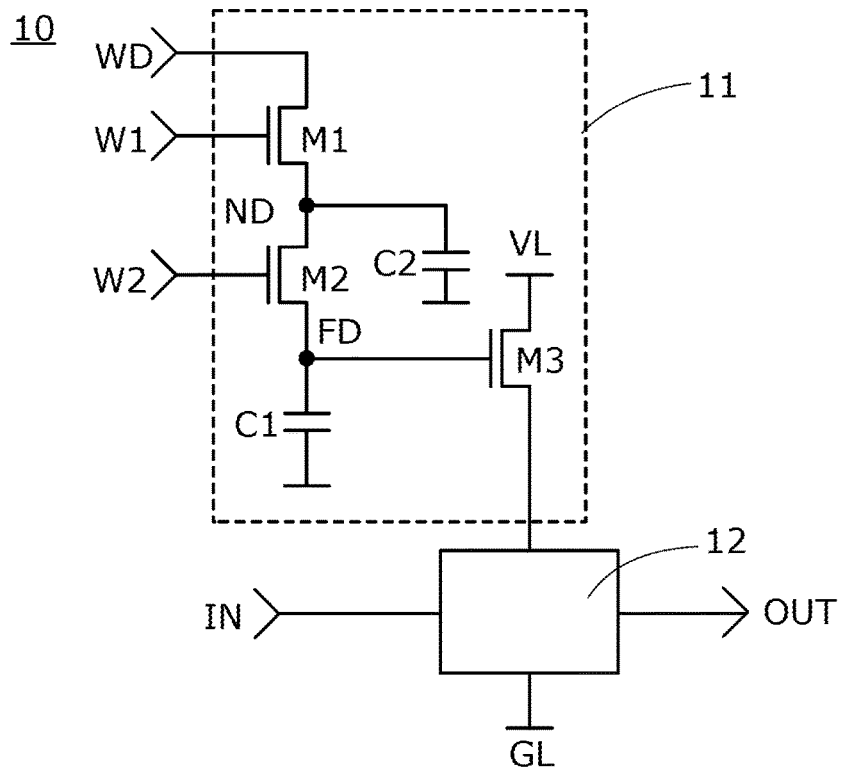
FIGS. 1A and 1B each illustrate an example of a structure of a semiconductor device.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. For example, the following can be included: variation in signal, voltage, or current due to noise or difference in timing.

In this specification, terms for describing arrangement, such as "over," "above," "under," and "below," are used for convenience in describing a positional relation between components with reference to drawings in some cases. Furthermore, the positional relation between components is changed as appropriate in accordance with a direction in which each component is described. Thus, there is no limitation on terms used in this specification, and description can be made appropriately depending on the situation.

The positional relation of circuit blocks illustrated in a block diagram is specified for description. Even when a block diagram shows that different functions are achieved by different circuit blocks, one circuit block may be actually configured to achieve different functions. The functions of circuit blocks are specified for description, and even in the case where one circuit block is illustrated, blocks might be provided in an actual circuit block so that processing performed by one circuit block is performed by a plurality of circuit blocks.

(Embodiment 1)

FIG. 1A illustrates an example of a semiconductor device of one embodiment of the present invention. A semiconductor device 10 illustrated in FIG. 1A includes a first circuit 11 and a second circuit 12. The first circuit 11 illustrated in FIG. 1A includes transistors M1, M2, and M3. In FIG. 1A, the transistors M1 to M3 are n-channel transistors.

The transistor M1 functions as a switch. One of a source and a drain of the transistor M1 is electrically connected to a wiring WD, the other of the source and the drain of the transistor M1 is electrically connected to one of a source and a drain of the transistor M2, and a gate of the transistor M1 is electrically connected to a wiring W1.

The transistor M2 functions as a switch. The other of the source and the drain of the transistor M2 is electrically connected to a gate of the transistor M3, and a gate of the transistor M2 is electrically connected to a wiring W2. One of a source and a drain of the transistor M3 is electrically connected to a wiring VL, and the other of the source and the drain of the transistor M3 is electrically connected to the second circuit 12.

The other of the source and the drain of the transistor M1 or the one of the source and the drain of the transistor M2 is a node ND. The transistor M1 can be regarded as having a function of supplying a potential of the wiring WD to the node ND according to a potential of the wiring W1. The other of the source and the drain of the transistor M2 or the gate of the transistor M3 is a node FD. The transistor M2 can be regarded as having a function of supplying a potential based on the potential of the node ND to the node FD according to a potential of the wiring W2.

The potential of the node ND is held by turning off the transistors M1 and M2. The potential of the node FD is held by turning off the transistor M2. A long holding time of the potential of the node ND or the potential of the node FD can be secured with the use of a transistor having small off-state current as each of the transistors M1 and M2.

Since the one of the source and the drain of the transistor M3 is electrically connected to the wiring VL, the transistor M3 functions as a source follower circuit. Thus, in the case where a potential supplied to the wiring VL is higher than a reference potential such as a ground potential and higher than the potential of the node FD, a potential of the other of the source and the drain of the transistor M3 has a value obtained by subtraction of the threshold voltage of the transistor M3 from the potential of the node FD. That is, the first circuit 11 can be regarded as having a function of controlling the level of the potential supplied to the second circuit 12 according to the potential of the node FD.

The semiconductor device 10 illustrated in FIG. 1A may further include a capacitor C1 and a capacitor C2 in the first circuit 11. The capacitor C1 has a function of holding the potential of the node FD, and the capacitor C2 has a function of holding the potential of the node ND. Owing to the capacitor C2 in the first circuit 11, the holding time of the potential of the node ND can be prolonged. Owing to the capacitor C1 in the first circuit 11, the holding time of the potential of the node FD can be prolonged.

The second circuit 12 illustrated in FIG. 1A has a function of outputting a second signal from an output terminal (OUT) according to a first signal input from an input terminal (IN). The signal delay time in the second circuit 12, i.e., the delay time from input of the first signal to the second circuit 12 to output of the second signal from the second circuit 12, is determined by the level of the potential supplied from the first circuit 11 to the second circuit 12.

Specifically, in the case where the potential supplied to the wiring VL is higher than a reference potential such as a ground potential and higher than the potential of the node FD in the first circuit 11, the potential supplied from the first circuit 11 to the second circuit 12 is changed according to the potential of the node FD. Specifically, the potential supplied from the first circuit 11 to the second circuit 12 has a value obtained by subtraction of the threshold voltage of the transistor M3 from the potential of the node FD. The signal delay time in the second circuit 12 is changed according to the potential supplied from the first circuit 11 to the second circuit 12.

Since the potential of the node ND or the potential of the node FD can be held in the semiconductor device 10 illustrated in FIG. 1A, the signal delay time in the second circuit 12, which is determined by the potential of the node FD, can be kept constant.

Figure 2A:
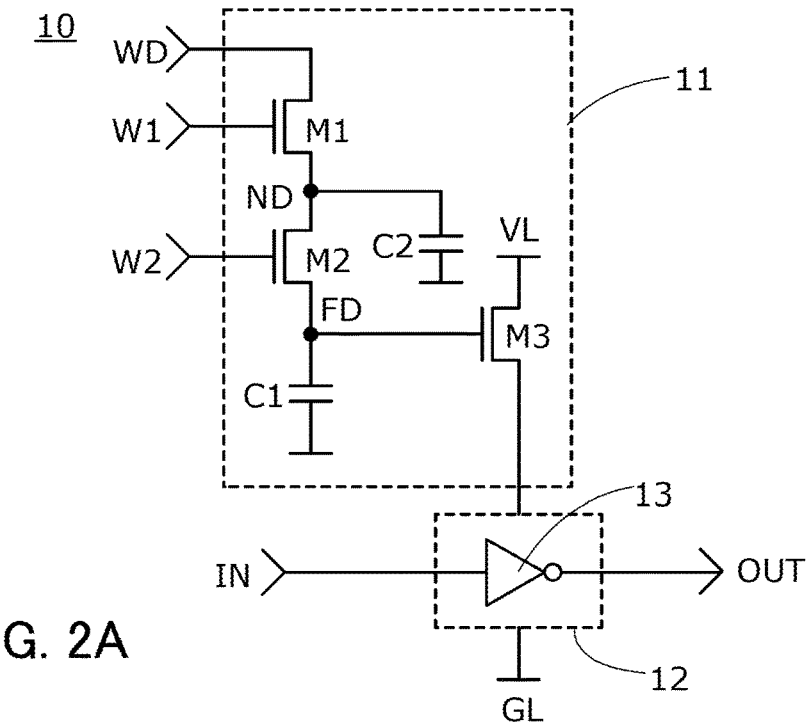
FIGS. 2A and 2B each illustrate an example of a structure of a semiconductor device.

In the semiconductor device 10 illustrated in FIG. 1A, a semiconductor element in which the signal delay time is determined by the level of a potential supplied thereto can be used for the second circuit 12. FIG. 2A illustrates an example of a specific circuit structure of the semiconductor device 10 illustrated in FIG. 1A. FIG. 2A illustrates, as an example, the case where the second circuit 12 includes an inverter 13 as the semiconductor element. Note that the second circuit 12 may include a clocked inverter or the like as the semiconductor element.

Figure 2B:
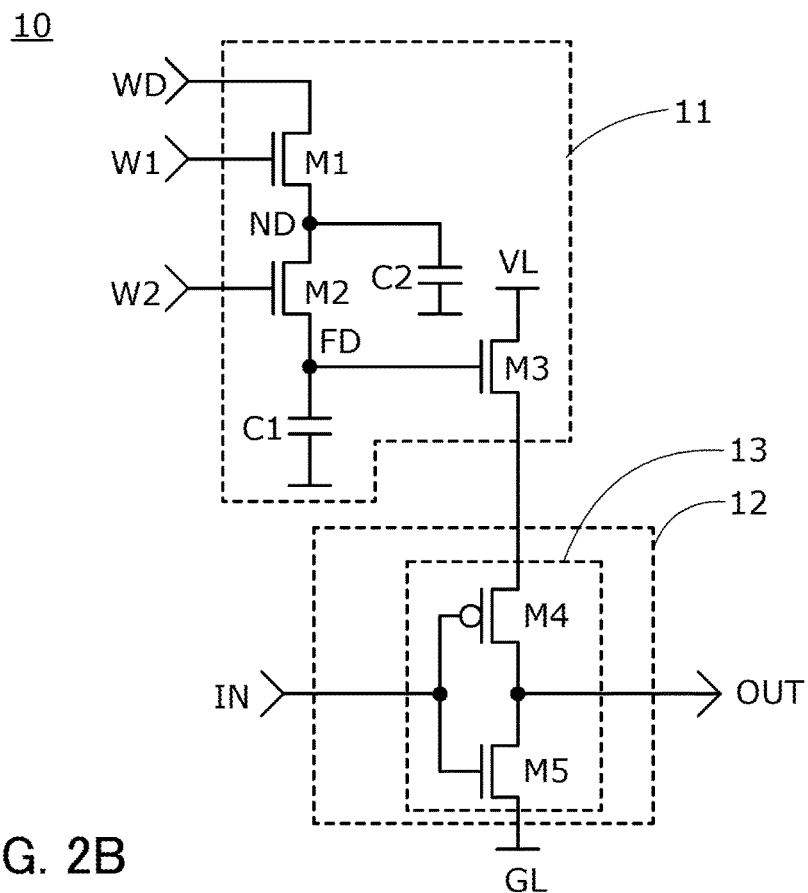

FIG. 2B illustrates an example of a more specific circuit structure of the semiconductor device 10 illustrated in FIG. 2A. FIG. 2B illustrates, as an example, the case where the semiconductor device 10 includes a p-channel transistor M4 and an n-channel transistor M5 in the inverter 13 in the second circuit 12. A gate of the transistor M4 and a gate of the transistor M5 are electrically connected to each other. One of a source and a drain of the transistor M4 is electrically connected to the other of the source and the drain of the transistor M3. The other of the source and the drain of the transistor M4 is electrically connected to one of a source and a drain of the transistor M5. The other of the source and the drain of the transistor M5 is electrically connected to a wiring GL.

A potential supplied to the wiring GL is lower than the potential supplied to the wiring VL.

In the semiconductor device 10 illustrated in FIG. 2B, the gate of the transistor M4 and the gate of the transistor M5 function as an input terminal of the inverter 13. The other of the source and the drain of the transistor M4 and the one of the source and the drain of the transistor M5 function as an output terminal of the inverter 13.

In the case where the potential supplied to the wiring VL is higher than a reference potential such as a ground potential and higher than the potential of the node FD in the first circuit 11, the potential of the other of the source and the drain of the transistor M3 is changed according to the potential of the node FD. Specifically, in the case where the potential of the node FD is relatively high, e.g., the case where the potential of the node FD is higher than a potential intermediate between the potential of the wiring VL and the reference potential, a potential difference between the one of the source and the drain of the transistor M4 and the other of the source and the drain of the transistor M5 becomes large. Accordingly, the signal delay time in the second circuit 12 is shortened.

On the other hand, in the case where the potential of the node FD is relatively low, e.g., the case where the potential of the node FD is lower than the intermediate potential, the potential difference between the one of the source and the drain of the transistor M4 and the other of the source and the drain of the transistor M5 becomes small. Accordingly, the signal delay time in the second circuit 12 is prolonged.

Figure 1B:
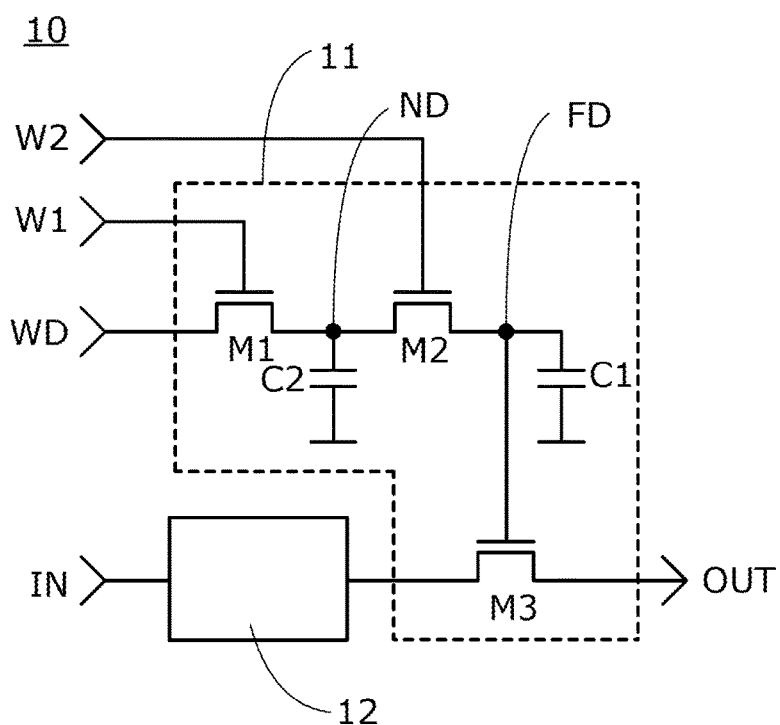

Next, FIG. 1B illustrates an example of a semiconductor device of one embodiment of the present invention. The semiconductor device 10 illustrated in FIG. 1B includes the first circuit 11 and the second circuit 12. The first circuit 11 illustrated in FIG. 1B includes the transistors M1, M2, and M3. In FIG. 1B, the transistors M1 to M3 are n-channel transistors.

The transistor M1 functions as a switch. The one of the source and the drain of the transistor M1 is electrically connected to the wiring WD, the other of the source and the drain of the transistor M1 is electrically connected to the one of the source and the drain of the transistor M2, and the gate of the transistor M1 is electrically connected to the wiring W1.

The transistor M2 functions as a switch. The other of the source and the drain of the transistor M2 is electrically connected to the gate of the transistor M3, and the gate of the transistor M2 is electrically connected to the wiring W2. The one of the source and the drain of the transistor M3 is electrically connected to the output terminal of the second circuit 12, and the other of the source and the drain of the transistor M3 functions as an output terminal of the semiconductor device 10.

The other of the source and the drain of the transistor M1 or the one of the source and the drain of the transistor M2 is the node ND. The transistor M1 can be regarded as having a function of supplying the potential of the wiring WD to the node ND according to the potential of the wiring W1. The other of the source and the drain of the transistor M2 or the gate of the transistor M3 is the node FD. The transistor M2 can be regarded as having a function of supplying the potential based on the potential of the node ND to the node FD according to the potential of the wiring W2.

The potential of the node ND is held by turning off the transistors M1 and M2. The potential of the node FD is held by turning off the transistor M2. A long holding time of the potential of the node ND or the potential of the node FD can be secured with the use of a transistor having small off-state current as each of the transistors M1 and M2.

The second circuit 12 illustrated in FIG. 1B has a function of outputting the second signal from the output terminal (OUT) according to the first signal input from the input terminal (IN). The resistance between the source and the drain of the transistor M3 is determined by the potential of the node FD. The lower the potential of the node FD is, the higher the resistance between the source and the drain of the transistor M3 is, resulting in a longer delay time of the second signal output from the output terminal of the second circuit 12 in the transistor M3. In contrast, the higher the potential of the node FD is, the lower the resistance between the source and the drain of the transistor M3 is, resulting in a shorter delay time of the second signal output from the output terminal of the second circuit 12 in the transistor M3. That is, the delay time is determined by the level of the potential of the node FD.

Since the potential of the node ND or the potential of the node FD can be held in the semiconductor device 10 illustrated in FIG. 1B, the signal delay time in the second circuit 12, which is determined by the potential of the node FD, can be kept constant.

The semiconductor device 10 illustrated in FIG. 1B may further include the capacitor C1 and the capacitor C2 in the first circuit 11. The capacitor C1 has a function of holding the potential of the node FD, and the capacitor C2 has a function of holding the potential of the node ND. Owing to the capacitor C2 in the first circuit 11, the holding time of the potential of the node ND can be prolonged. Owing to the capacitor C1 in the first circuit 11, the holding time of the potential of the node FD can be prolonged.

Figure 3A:
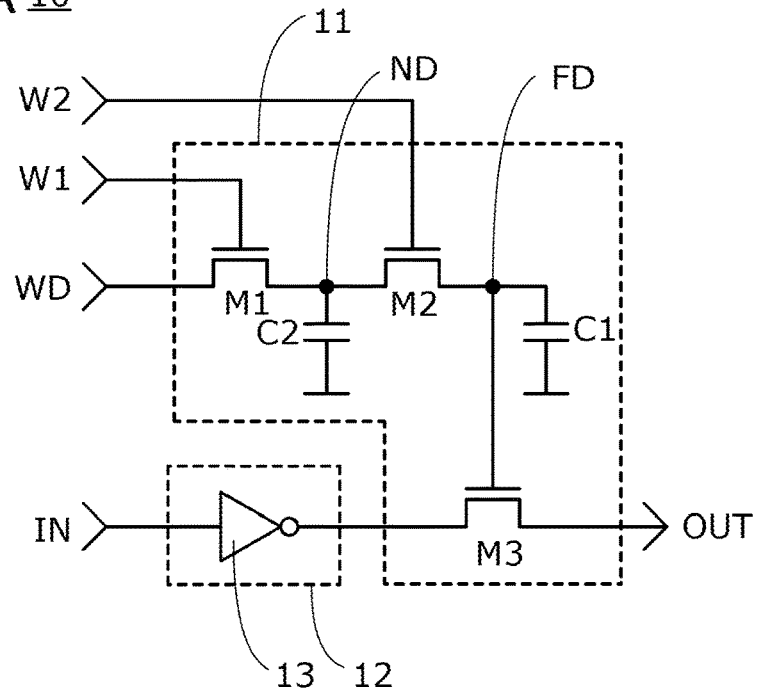
FIGS. 3A and 3B each illustrate an example of a structure of a semiconductor device.

Next, FIG. 3A illustrates an example of a specific circuit structure of the semiconductor device 10 illustrated in FIG. 1B. FIG. 3A illustrates, as an example, the case where the second circuit 12 includes the inverter 13 as the semiconductor element. Note that the second circuit 12 may include a clocked inverter or the like as the semiconductor element.

Figure 3B:
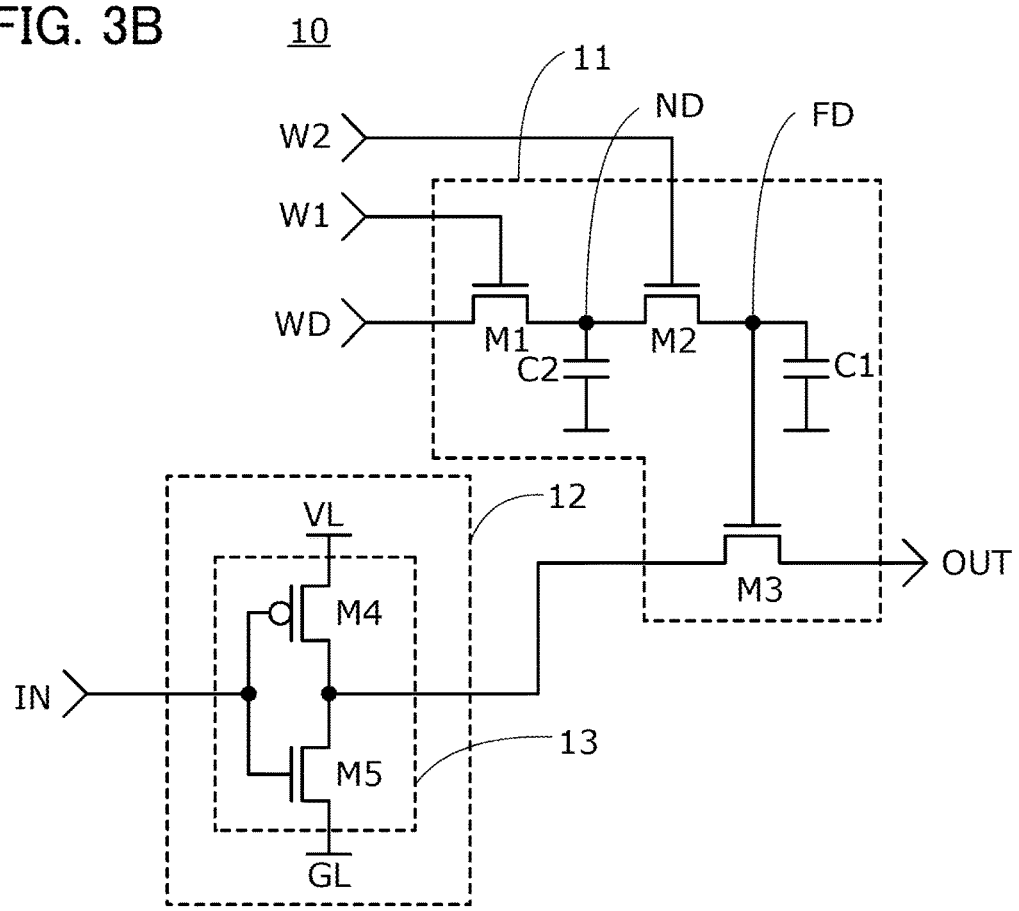

FIG. 3B illustrates an example of a more specific circuit structure of the semiconductor device 10 illustrated in FIG. 3A. FIG. 3B illustrates, as an example, the case where the semiconductor device 10 includes the p-channel transistor M4 and the n-channel transistor M5 in the inverter 13 in the second circuit 12. The gate of the transistor M4 and the gate of the transistor M5 are electrically connected to each other. The one of the source and the drain of the transistor M4 is electrically connected to the wiring VL supplied with a high-level potential. The other of the source and the drain of the transistor M4 is electrically connected to the one of the source and the drain of the transistor M5. The other of the source and the drain of the transistor M5 is electrically connected to the wiring GL supplied with a low-level potential.

In the semiconductor device 10 illustrated in FIG. 3B, the gate of the transistor M4 and the gate of the transistor M5 function as the input terminal of the inverter 13. The other of the source and the drain of the transistor M4 and the one of the source and the drain of the transistor M5 function as the output terminal of the inverter 13. The output terminal of the inverter 13 is electrically connected to the one of the source and the drain of the transistor M3.

Next, an example of operation of the first circuit 11 of the semiconductor device 10 illustrated in FIG. 1A or FIG. 1B is described with reference to a timing chart in FIG. 4. In the following description of the operation, the transistors M1 to M3 are assumed to be n-channel transistors and to have a threshold voltage of 0 V.

At time T0, the potential of the wiring W1 is set at a high level, and the transistor M1 is turned on. The potential of the wiring W2 is set at a high level, and the transistor M2 is turned on. Thus, the potential of the wiring WD is supplied to the node ND through the transistor M1. The potential of the wiring WD is also supplied to the node FD through the transistors M1 and M2.

The signal delay time in the second circuit 12 is determined by a potential Va of the node FD.

Then, at time T1, the potential of the wiring W2 is changed from the high level to a low level, and the transistor M2 is turned off. At this time, with the change in the potential of the wiring W2, the potential of the node FD is slightly decreased to be a potential Va' by the capacitive coupling between the gate and the source (or between the gate and the drain) of the transistor M2. The potential Va' is held at the node FD.

Then, at time T2, the potential of the wiring W1 is changed from the high level to a low level, and the transistor M1 is turned off At this time, with the change in the potential of the wiring W1, the potential of the node ND is slightly decreased to be the potential Va' by the capacitive coupling between the gate and the source (or between the gate and the drain) of the transistor M1. The potential Va' is held at the node ND.

Then, at time T3, the potential of the wiring W2 is changed from the low level to the high level, and the transistor M2 is turned on. At this time, with the change in the potential of the wiring W2, the potential of the node FD and the potential of the node ND are slightly increased by the capacitive coupling between the gate and the source and between the gate and the drain of the transistor M2. An increase in the potential of the node FD and an increase in the potential of the node ND at time T3 can almost cancel a decrease in the potential of the node FD at time T1 and a decrease in the potential of the node ND at time T2, and the potential of the node FD at and after time T3 can be extremely close to the potential Va.

Figure 4:
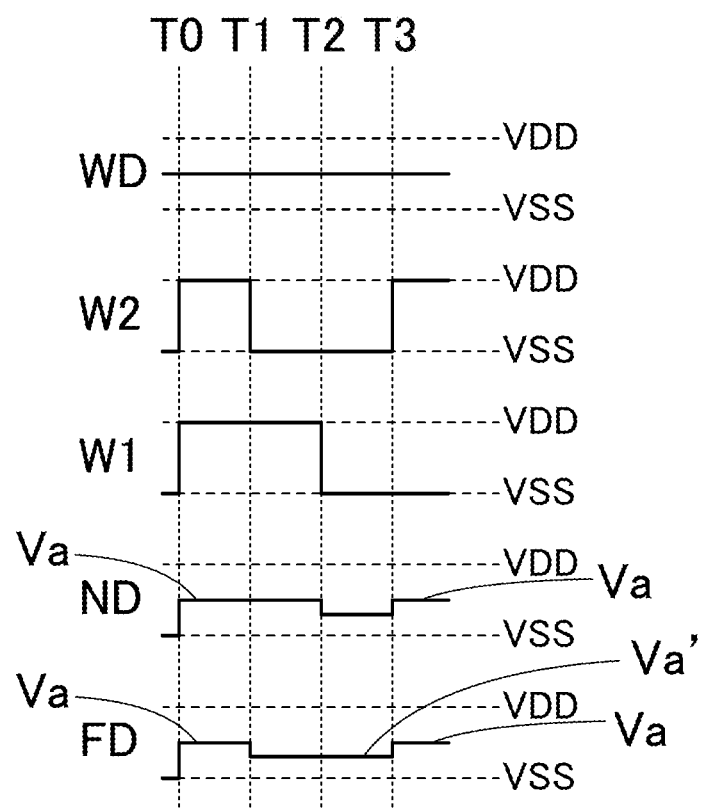
FIG. 4 is a timing chart.

The mechanism of canceling the change in the potentials of the nodes FD and ND at time T3 in FIG. 4 is described with reference to FIG. 5.

Figure 5:
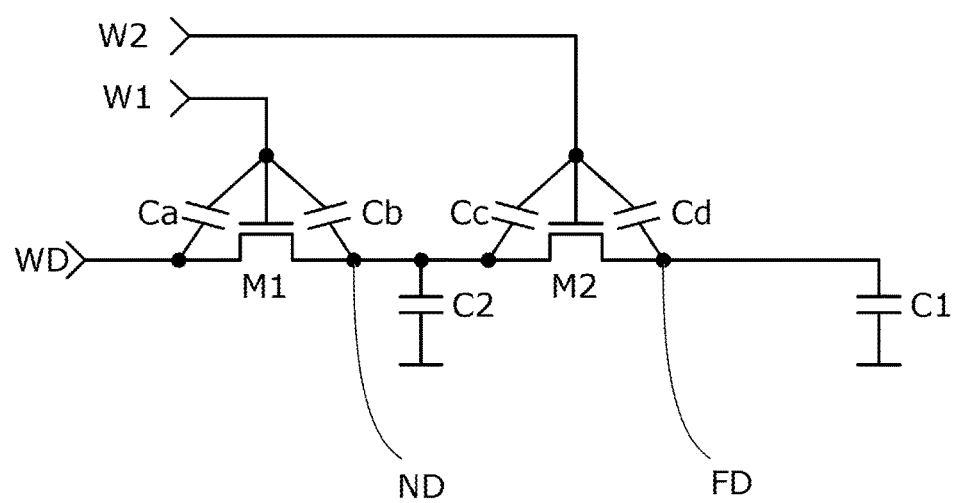
FIG. 5 is a diagram in which transistors M1 and M2 and capacitors C1 and C2 are extracted from a first circuit 11.

FIG. 5 corresponds to a drawing in which the transistors M1 and M2 and the capacitors C1 and C2 are extracted from the first circuit 11. In FIG. 5, the capacitance between the gate and the one of the source and the drain of the transistor M1 is Ca, the capacitance between the gate and the other of the source and the drain of the transistor M1 is Cb, the capacitance between the gate and the one of the source and the drain of the transistor M2 is Cc, and the capacitance between the gate and the other of the source and the drain of the transistor M2 is Cd.

At time T1 when the potential of the wiring W2 is changed from the high level to the low level, the change in the potential of the node FD can be expressed by −q1×Cd/(Cd+C1) with q1 representing charge of the node FD (capacitor C1). At this time, since the node ND is electrically connected to the wiring WD through the transistor M1, the potential of the node ND is not changed.

At time T2 when the potential of the wiring W1 is changed from the high level to the low level, the change in the potential of the node ND can be expressed by −q2×Cb/(Cb+Cc+C2) with q2 representing charge of the node ND (capacitor C2).

At time T3 when the potential of the wiring W2 is changed from the low level to the high level, the change in the potential of the node FD can be expressed by +q1×Cd/(Cd+C1), and the change in the potential of the node ND can be expressed by +q2×Cc/(Cd+Cc+C2). On the assumption that the transistors M1 and M2 have the same size, Cb is ideally equal to Cc. Accordingly, the change in the potentials of the nodes FD and ND at time T1 and time T2 is canceled by the change in the potentials of the nodes FD and ND at time T3.

Figure 29A:
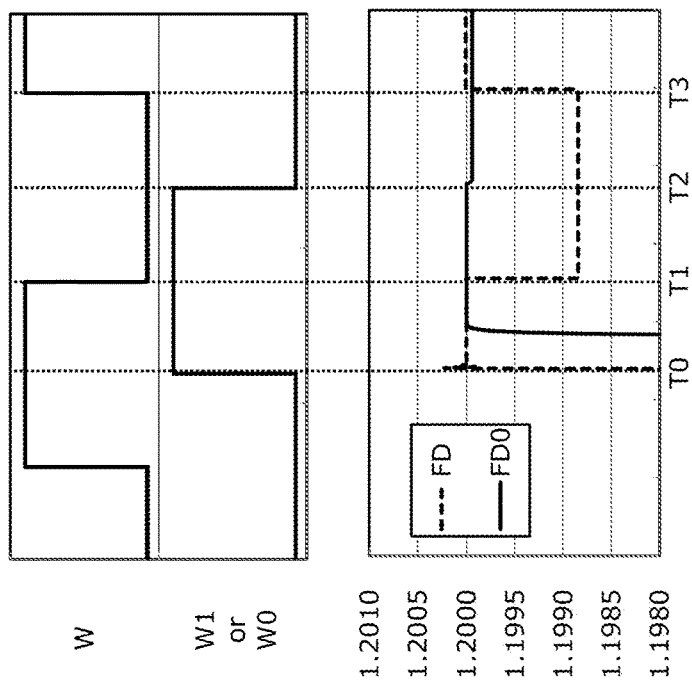
FIGS. 29A and 29B each show simulation results.
Figure 29B:
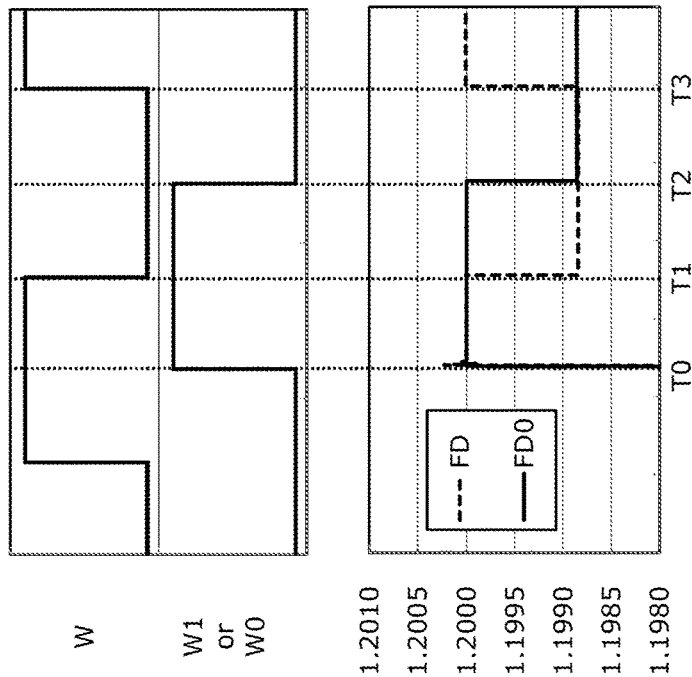

FIGS. 29A and 29B show SPICE simulation results of calculating the potential of the node FD of the first circuit 11 illustrated in FIG. 1A. Note that FIGS. 29A and 29B also show results of calculating a potential of a node FD0 in a circuit 41 illustrated in FIG. 6 as a comparative example. The circuit 41 illustrated in FIG. 6 includes a transistor M11, a transistor M13, and a capacitor C11. A gate of the transistor M11 is electrically connected to a wiring W0, one of a source and a drain of the transistor M11 is electrically connected to the wiring WD, and the other of the source and the drain of the transistor M11 is electrically connected to a gate of the transistor M13. The capacitor C11 has a function of holding the potential of the node FD0.

Figure 6:
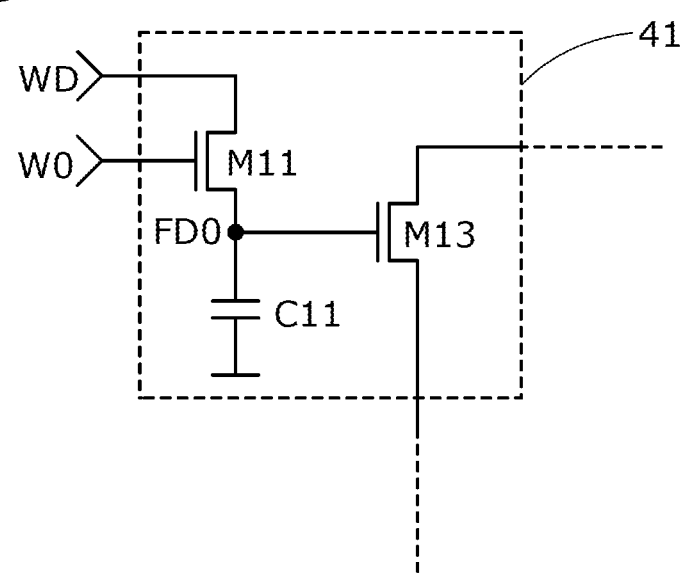
FIG. 6 illustrates a circuit of a comparative example.

Specifically, FIGS. 29A and 29B show the results of calculating the change in the potentials of the wirings W1 and W2 and the node FD in the first circuit 11 and the change in the potentials of the wiring W0 and the node FD0 in the circuit 41 illustrated in FIG. 6.

The simulation in FIG. 29A is run under the following assumption: a potential of 1.2 V is written to the nodes FD and FD0; the capacitance of the capacitor C1 and the capacitance of the capacitor C2 in the first circuit 11 are both 5 fF; the capacitance of the capacitor C11 in the circuit 41 illustrated in FIG. 6 is 5 fF; and the transistors M1 to M3 in the first circuit 11 and the transistors M11 and M13 in the circuit 41 illustrated in FIG. 6 are c-axis-aligned crystalline oxide semiconductor (CAAC-OS) FETs (channel length L/channel width W=60 nm/60 nm) having small off-state current. Note that CAAC-OS will be described in detail in Embodiment 8.

The simulation in FIG. 29B is run under the following assumption: a potential of 1.2 V is written to the nodes FD and FD0; the capacitance of the capacitor C1 and the capacitance of the capacitor C2 in the first circuit 11 are both 5 fF; the capacitance of the capacitor C11 in the circuit 41 illustrated in FIG. 6 is 100 fF; and the transistors M1 to M3 in the first circuit 11 and the transistors M11 and M13 in the circuit 41 illustrated in FIG. 6 are CAAC-OS FETs (channel length L/channel width W=60 nm/60 nm) having small off-state current.

The simulation results of the potential of the node FD in the first circuit 11, which are shown in FIG. 29A, are described first. In the first circuit 11, the potential of the wiring W1 is at the high level and the potential of the wiring W2 is at the high level at time T0, so that the transistors M1 and M2 are turned on and the potential of the node FD is 1.2000 V. Then, the potential of the wiring W2 is changed from the high level to the low level at time T1, and the potential of the node FD is decreased to 1.19884 V because of the capacitive coupling between the gate and the source (or between the gate and the drain) of the transistor M2. Then, the potential of the wiring W1 is changed from the high level to the low level at time T2, so that the transistor M1 is turned off The potential of the wiring W2 is changed from the low level to the high level at time T3, and the potential of the node FD is increased to 1.20001 V because of the capacitive coupling between the gate and the source and between the gate and the drain of the transistor M2. This shows that the change in the potential of the node FD because of the capacitive coupling is canceled when the first circuit 11 is used.

Next, the simulation results of the potential of the node FD0 in the circuit 41, which are shown in FIG. 29A, are described. In the circuit 41, the potential of the wiring W0 is at the high level at time T0, so that the transistor M11 is turned on and the potential of the node FD0 is 1.2000 V. Then, the potential of the wiring W0 is changed from the high level to the low level at time T2, and the potential of the node FD0 is decreased to 1.19886 V because of the capacitive coupling between the gate and the source (or between the gate and the drain) of the transistor M11. Since the circuit 41 does not have the mechanism of canceling the change in the potential because of the capacitive coupling, the potential of the node FD0 remains decreased after time T2.

Next, the simulation results shown in FIG. 29B are described. In FIG. 29B, the simulation results of the potential of the node FD in the first circuit 11 are similar to those shown in FIG. 29A and thus are not described here. Unlike in the simulation in FIG. 29A, the capacitance of the capacitor C11 in the circuit 41 is assumed to be 100 fF in the simulation in FIG. 29B.

In FIG. 29B, the potential of the wiring W0 is changed from the low level to the high level at time T0, so that the transistor M11 is turned on and the potential of the node FD0 is 1.2000 V. Since the capacitance of the capacitor C11 is 100 fF, charging takes long time as compared to the other condition. Then, the potential of the wiring W0 is changed from the high level to the low level at time T2, and the potential of the node FD0 is decreased to 1.19994 V because of the capacitive coupling between the gate and the source (or between the gate and the drain) of the transistor M11. Since the circuit 41 does not have the mechanism of canceling the change in the potential because of the capacitive coupling, the potential of the node FD0 remains decreased after time T2.

As described above, the change in the potential of the node FD because of the capacitive coupling can be canceled by using the first circuit 11. Although the change in the potential of the node FD0 can be suppressed with larger capacitance of the capacitor C11 in the circuit 41, the change in the potential of the node FD0 in the circuit 41 is bigger than the change in the potential of the node FD in the first circuit 11 (1.20001 V, the potential of the node FD at time T3) in which the change in the potential is canceled, even when the capacitance in the circuit 41 is 20 times that in the first circuit 11, for example.

(Embodiment 2)

Figure 7A:
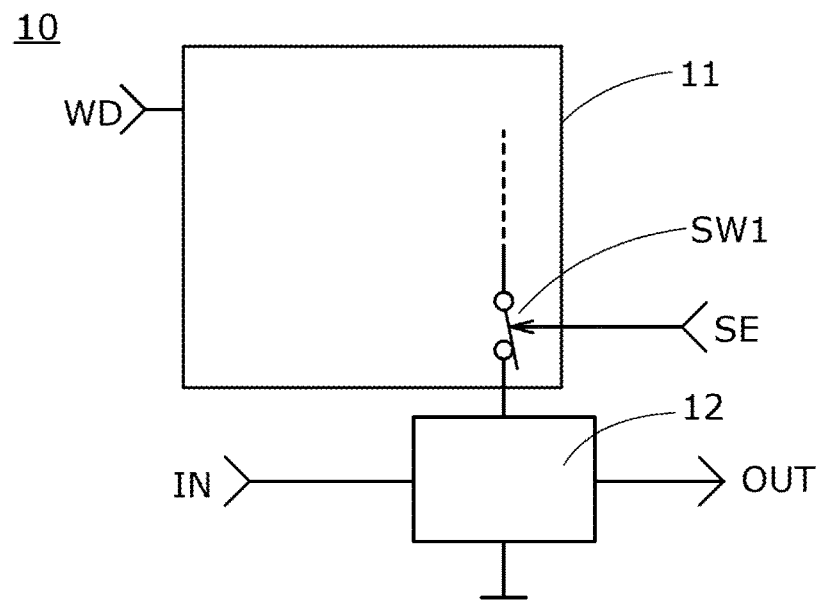
FIGS. 7A and 7B each illustrate an example of a structure of a semiconductor device.

FIG. 7A illustrates another example of a semiconductor device of one embodiment of the present invention. The semiconductor device 10 illustrated in FIG. 7A includes the first circuit 11 and the second circuit 12. In FIG. 7A, the first circuit 11 includes a switch SW1, which has a function of controlling supply of a potential to the second circuit 12 according to a potential of a wiring SE. The signal delay time in the second circuit 12 is determined by the potential supplied from the first circuit 11.

Figure 7B:
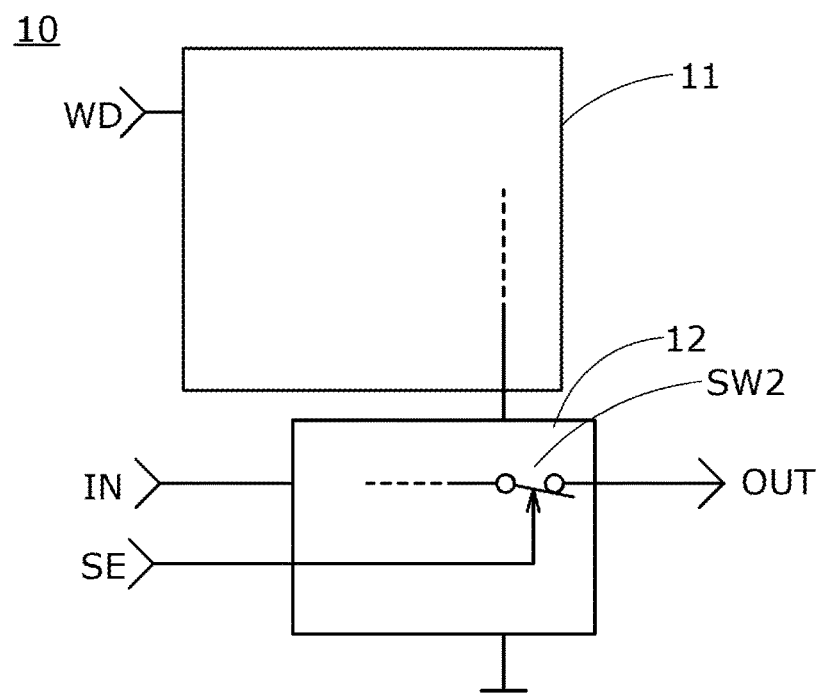

FIG. 7B illustrates another example of a semiconductor device of one embodiment of the present invention. The semiconductor device 10 illustrated in FIG. 7B includes the first circuit 11 and the second circuit 12. In FIG. 7B, the second circuit 12 includes a switch SW2. The signal delay time in the second circuit 12 is determined by the potential supplied from the first circuit 11. The switch SW2 has a function of controlling output of the delayed signal in the second circuit 12 from the output terminal (OUT) of the semiconductor device 10.

Figure 8:
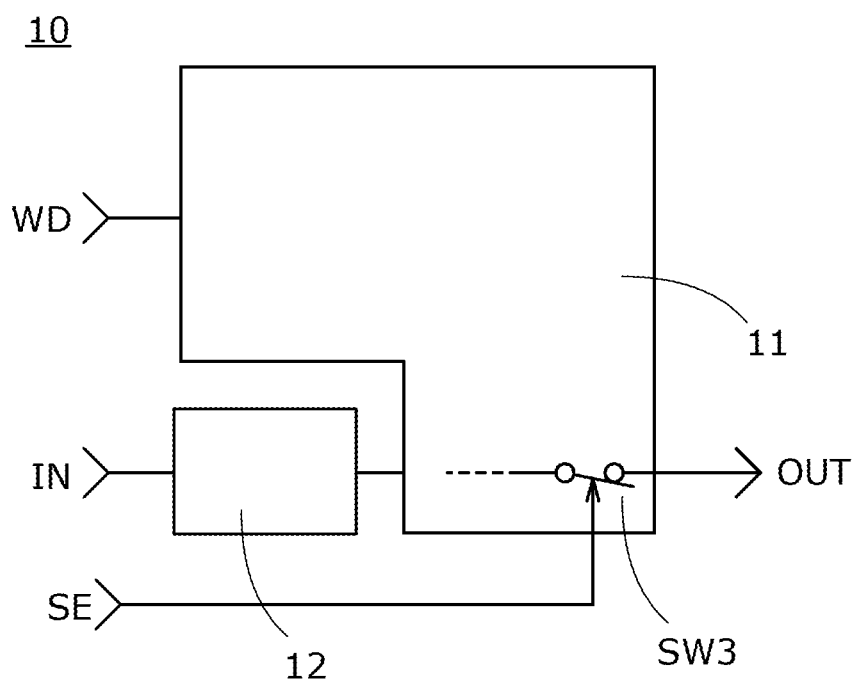
FIG. 8 illustrates an example of a structure of a semiconductor device.

FIG. 8 illustrates another example of a semiconductor device of one embodiment of the present invention. The semiconductor device 10 illustrated in FIG. 8 includes the first circuit 11 and the second circuit 12. In FIG. 8, the first circuit 11 includes a switch SW3. The signal delay time in the second circuit 12 is determined by the potential supplied from the first circuit 11. The switch SW3 has a function of controlling output of the delayed signal in the second circuit 12 from the output terminal (OUT) of the semiconductor device 10.

Figure 9A:
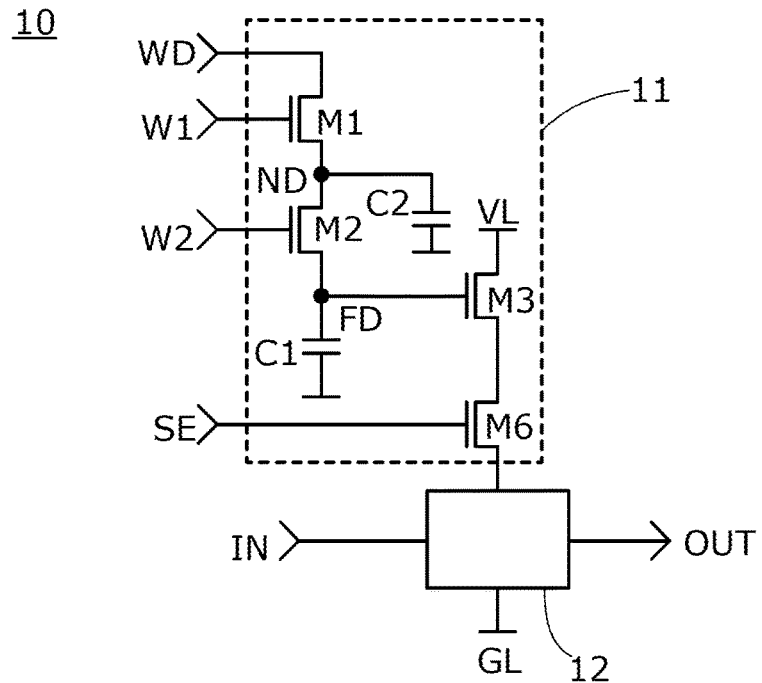
FIGS. 9A and 9B each illustrate an example of a structure of a semiconductor device.

FIG. 9A illustrates an example of a specific circuit structure of the semiconductor device 10 illustrated in FIG. 7A. The semiconductor device 10 illustrated in FIG. 9A has a structure in which a transistor M6 is added to the semiconductor device 10 illustrated in FIG. 1A. The transistor M6 functions as the switch SW1. Specifically, a gate of the transistor M6 is electrically connected to the wiring SE, one of a source and a drain of the transistor M6 is electrically connected to the other of the source and the drain of the transistor M3, and the other of the source and the drain of the transistor M6 is electrically connected to the second circuit 12.

Figure 9B:
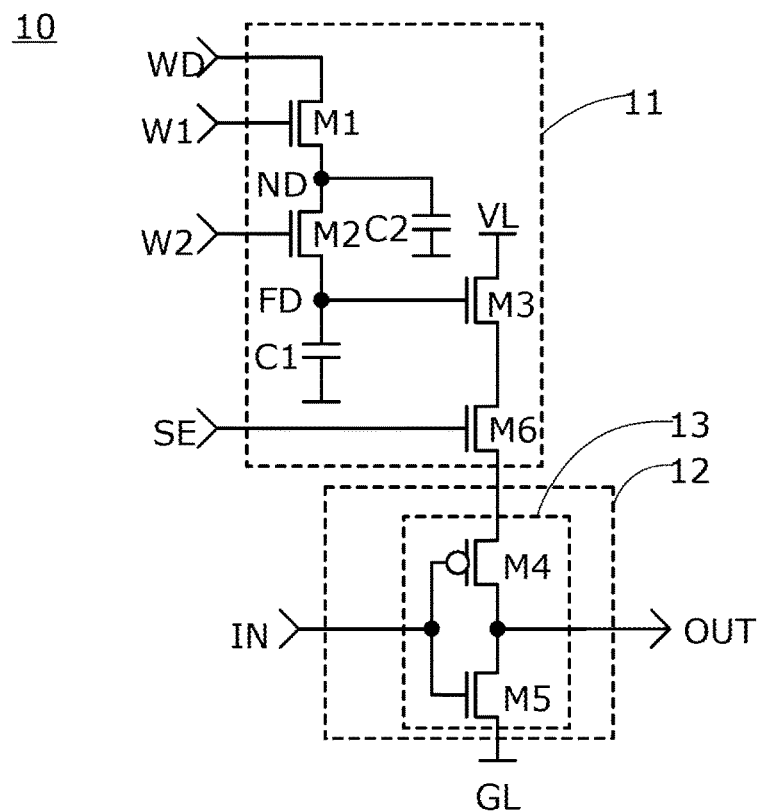

FIG. 9B illustrates an example of a more specific circuit structure of the semiconductor device 10 illustrated in FIG. 9A. The semiconductor device 10 illustrated in FIG. 9B has a structure in which the transistor M6 is added to the semiconductor device 10 illustrated in FIG. 2B. Specifically, the other of the source and the drain of the transistor M6 is electrically connected to the one of the source and the drain of the transistor M4.

Figure 10A:
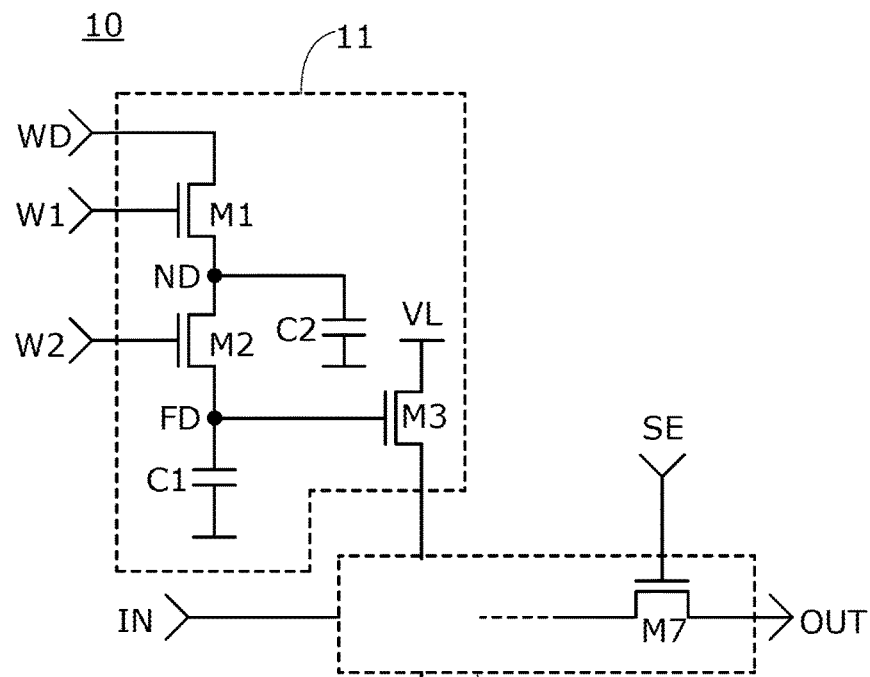
FIGS. 10A and 10B each illustrate an example of a structure of a semiconductor device.

FIG. 10A illustrates an example of a specific circuit structure of the semiconductor device 10 illustrated in FIG. 7B. The semiconductor device 10 illustrated in FIG. 10A has a structure in which a transistor M7 is added to the semiconductor device 10 illustrated in FIG. 1A. The transistor M7 functions as the switch SW2. Specifically, a gate of the transistor M7 is electrically connected to the wiring SE, one of a source and a drain of the transistor M7 is electrically connected to an output terminal of a semiconductor element having a function of delaying a signal, such as an inverter, and the other of the source and the drain of the transistor M7 is electrically connected to the output terminal of the second circuit 12.

Figure 10B:
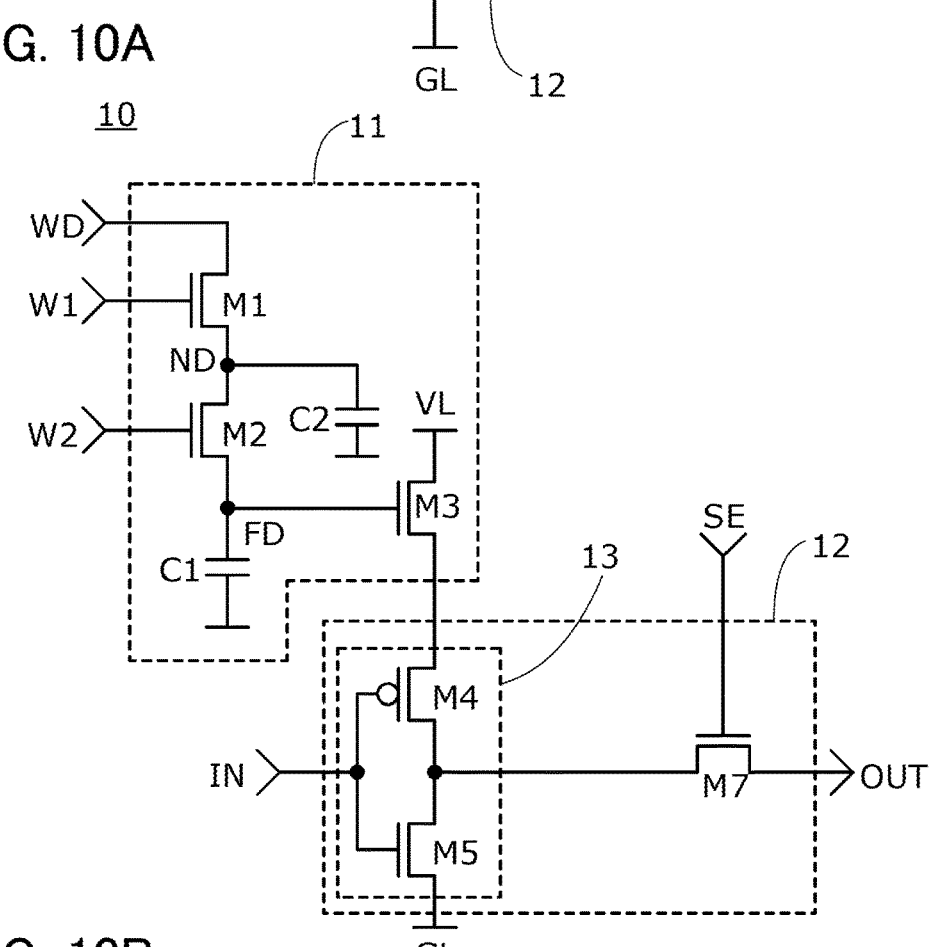

FIG. 10B illustrates an example of a more specific circuit structure of the semiconductor device 10 illustrated in FIG. 10A. The semiconductor device 10 illustrated in FIG. 10B has a structure in which the transistor M7 is added to the semiconductor device 10 illustrated in FIG. 2B. Specifically, the one of the source and the drain of the transistor M7 is electrically connected to the output terminal of the inverter 13, and the other of the source and the drain of the transistor M7 is electrically connected to the output terminal of the second circuit 12.

Figure 11:
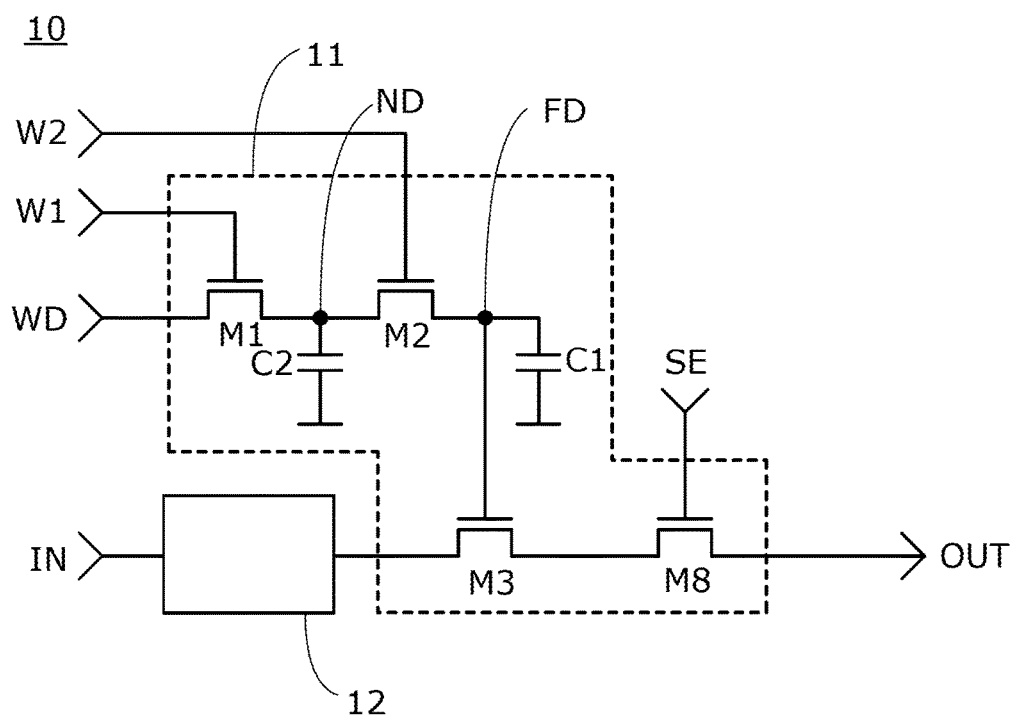
FIG. 11 illustrates an example of a structure of a semiconductor device.

FIG. 11 illustrates an example of a specific circuit structure of the semiconductor device 10 illustrated in FIG. 8. The semiconductor device 10 illustrated in FIG. 11 has a structure in which a transistor M8 is added to the semiconductor device 10 illustrated in FIG. 1B. The transistor M8 functions as the switch SW3. Specifically, a gate of the transistor M8 is electrically connected to the wiring SE, one of a source and a drain of the transistor M8 is electrically connected to the other of the source and the drain of the transistor M3, and the other of the source and the drain of the transistor M8 is electrically connected to the output terminal of the first circuit 11.

This embodiment can be implemented in appropriate combinations with any of the other embodiments.

(Embodiment 3)

An example of an oscillator circuit of one embodiment of the present invention using the semiconductor device 10 is described with reference to FIG. 12.

Figure 12:
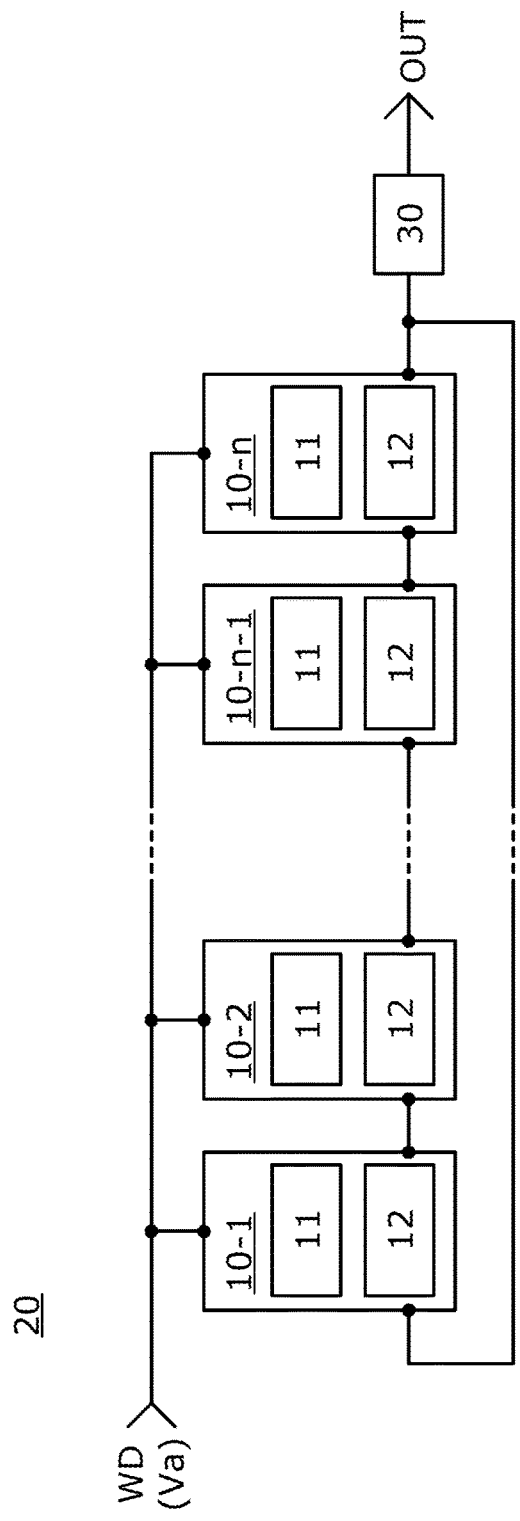
FIG. 12 illustrates an example of a structure of an oscillator circuit.

An oscillator circuit 20 illustrated in FIG. 12 includes the n semiconductor devices 10 (10-1 to 10-n). Note that n is an odd number. As described above, the semiconductor device 10 includes the first circuit 11 and the second circuit 12. FIG. 12 illustrates a structure example of the oscillator circuit 20 in which a circuit 30 is included in addition to the semiconductor devices 10-1 to 10-n.

The semiconductor devices 10-1 to 10-n are electrically connected to the wiring WD. The wiring WD has a function of supplying a potential Vcnf to the semiconductor devices 10-1 to 10-n. Although one wiring WD is electrically connected to the semiconductor devices 10-1 to 10-n in the oscillator circuit 20 illustrated in FIG. 12, at least one of the semiconductor devices 10-1 to 10-n may be electrically connected to a different wiring WD from the wiring WD to which the other semiconductor devices 10 are electrically connected. In this case, a potential Vcnf that is different from the potential Vcnf supplied to the other semiconductor devices 10 can be written to the semiconductor device 10 electrically connected to the different wiring WD from the wiring WD to which the other semiconductor devices 10 are electrically connected.

The semiconductor devices 10-1 to 10-n in the oscillator circuit 20 illustrated in FIG. 12 are circularly and electrically connected to each other such that a signal output from an output terminal of one semiconductor device 10 is input to an input terminal of the following semiconductor device 10. A signal output from the output terminal of the semiconductor device 10-n is input to the input terminal of the semiconductor device 10-1 and also to an input terminal of the circuit 30. A signal output from an output terminal of the circuit 30 is supplied to the output terminal (OUT) of the oscillator circuit 20.

The semiconductor devices 10-1 to 10-n each have a function of delaying outputting the signal input to its input terminal from its output terminal, whereby a signal having an oscillation frequency fvco is output from the output terminal of the oscillator circuit 20. The signal delay time in each of the semiconductor devices 10-1 to 10-n can be determined by the potential Vcnf input to each of the semiconductor devices 10-1 to 10-n through the wiring WD. The value of the oscillation frequency fvco is determined by the signal delay time in the semiconductor devices 10-1 to 10-n. Thus, the oscillator circuit 20 can be regarded as having a function of determining the value of the oscillation frequency fvco of the output signal according to the potential Vcnf.

The circuit 30 has a function of adjusting an amplitude or a potential level of the signal input from the input terminal. A level-shift circuit can be used as the circuit 30, for example.

Although FIG. 12 illustrates the structure example of the oscillator circuit 20 including the circuit 30, the oscillator circuit 20 does not necessarily include the circuit 30. Note that in the case where a low oscillation frequency fvco is assumed to be obtained from the oscillator circuit 20, the signal delay time in the second circuit 12 needs to be longer than that in the case where a high oscillation frequency fvco is assumed to be obtained from the oscillator circuit 20; thus, the amplitude of the signal output from the second circuit 12 is small. Accordingly, the circuit 30 is preferably provided in the case where a low oscillation frequency fvco is assumed to be obtained from the oscillator circuit 20.

Figure 13:
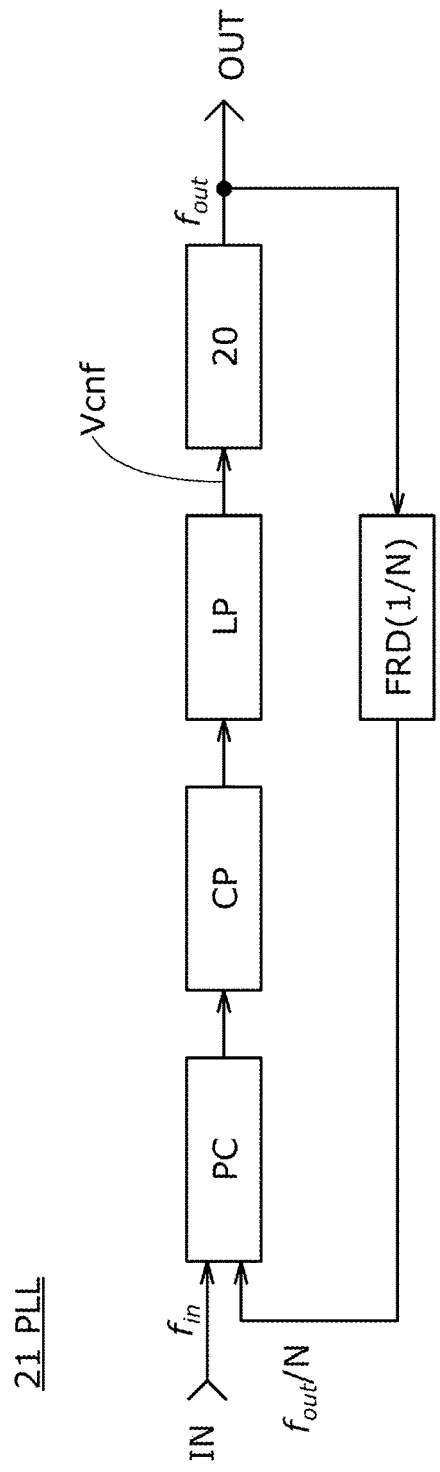
FIG. 13 illustrates an example of a structure of a PLL.

FIG. 13 illustrates an example of a structure of a phase-locked loop (PLL) 21 including the oscillator circuit 20.

The PLL 21 illustrated in FIG. 13 includes a phase comparator PC, a charge pump CP, a loop filter LP, the oscillator circuit 20, and a frequency divider FRD. A signal $f_{in}$ from an input terminal (IN) of the PLL 21 and a signal $f_{out}/N$ from the frequency divider FRD are input to the phase comparator PC. The phase comparator PC has a function of detecting a phase difference between the two input signals. Specifically, the phase comparator PC has a function of generating a signal with a voltage reflecting the phase difference between the signal $f_{in}$ and the signal $f_{out}/N$.

The charge pump CP has a function of controlling a potential of an output signal according to the phase difference detected by the phase comparator PC. The loop filter LP has a function of removing an AC (alternating current) component from an input signal by averaging a potential of the signal in the case where the input signal has ripple. For example, a low-pass filter, which has a function of removing a high-frequency component from an input signal, can be used as the loop filter LP.

The oscillator circuit 20 has a function of generating a clock signal. The oscillator circuit 20 has a function of determining the oscillation frequency of the clock signal according to the potential Vcnf of an input signal. The frequency divider FRD has a function of generating a clock signal whose frequency is 1/N times the frequency of the clock signal generated in the oscillator circuit 20.

An example of operation of the PLL 21 illustrated in FIG. 13 is described with reference to a timing chart of FIG. 14. Note that the PLL 21 includes the oscillator circuit 20 in FIG. 12 which includes the semiconductor devices 10 illustrated in FIG. 3B, for example. For easy understanding, the threshold voltage of each of the transistors M1 to M5 is assumed to be 0 V in the following description of the operation.

In the semiconductor device 10 illustrated in FIG. 3B, the potentials of the wirings W1 and W2 are set to a high level at time T0, so that the transistors M1 and M2 are turned on. Then, the potential Vcnf of the wiring WD is supplied to the node FD through the transistors M1 and M2. In the timing chart of FIG. 14, the potential Vcnf at time T0 is higher than the threshold voltages of the transistors M1 to M5 (i.e., higher than 0 V). Thus, when the potential Vcnf is supplied to the node FD, the transistor M3 is turned on.

When the transistor M3 is turned on, the signal delay time is set according to the potential Vcnf in each semiconductor device 10, and the signal $f_{out}$ having the oscillation frequency fvco is output from the oscillator circuit 20. In the PLL 21, the frequency of the signal $f_{out}$ output from the oscillator circuit 20 is divided by N by the frequency divider FRD and the signal $f_{out}/N$ obtained by the frequency division is fed back to the phase comparator PC in a period between time T0 and time T1. Then, the phase comparator PC compares the phase of the reference signal $f_{in}$ and the phase of the feedback signal $f_{out}/N$ and the potential of the signal output from the charge pump CP is controlled on the basis of the comparison result. The loop filter LP removes a high-frequency component from the signal output from the charge pump CP and outputs the resulting signal as the potential Vcnf. The output potential Vcnf is input to the oscillator circuit 20 through the wiring WD.

Figure 14:
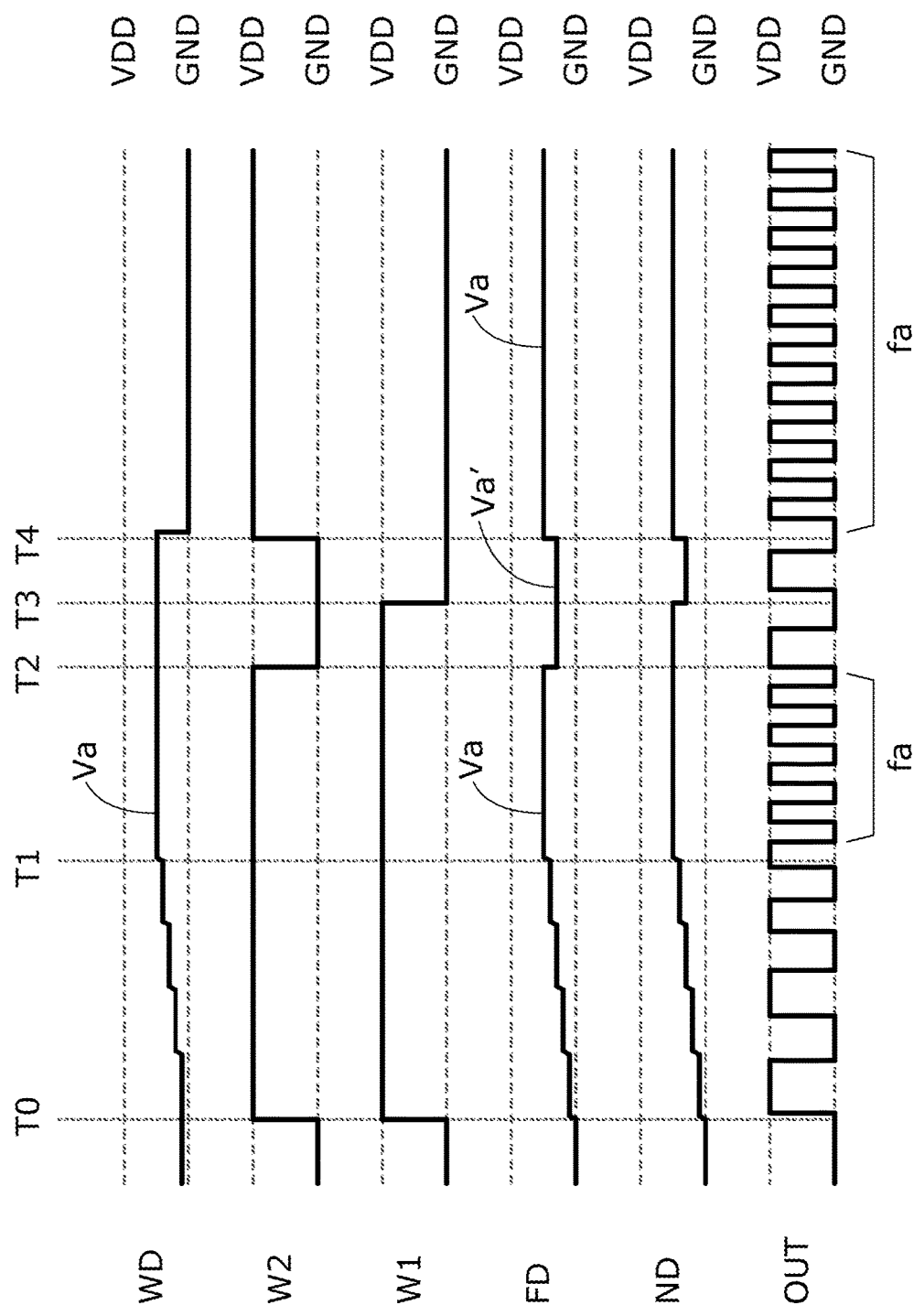
FIG. 14 is a timing chart.

The timing chart of FIG. 14 shows a process in which the potential Vcnf of the wiring WD is gradually increased during the period from time T0 to time T1 due to the oscillation frequency fvco of the oscillator circuit 20 lower than the oscillation frequency of the reference signal $f_{in}$.

At time T1, the potential Vcnf of the wiring WD is assumed to reach the potential Va. The potential Va is supplied to the node FD through the transistors M1 and M2. The potential Va is supplied to the node FD, whereby the oscillation frequency fvco of the output signal $f_{out}$ of the oscillator circuit 20 becomes an oscillation frequency fa. In the case where a desired oscillation frequency fa is obtained, the PLL 21 locks the oscillation frequency fvco after the oscillation frequency fvco becomes the oscillation frequency fa.

In the timing chart of FIG. 14, the PLL 21 keeps the oscillation frequency fvco locked from time T2 to time T4. Specifically, the potential of the wiring W2 is changed from the high level to the low level at time T2, and the potential of the wiring W1 is changed from the high level to the low level at time T3. Then, the potential of the wiring W2 is returned to the high level from the low level at time T4. Through the above operation, the potential Va is held at the node FD, so that the oscillation frequency fvco is locked to the oscillation frequency fa.

Then, in a manner similar to the case shown in FIG. 4 and FIG. 5, at time T2, the potential of the wiring W2 is changed from the high level to the low level, and the potential of the node FD is slightly decreased and is changed from the potential Va to the potential Va'. At time T3, the potential of the wiring W1 is changed from the high level to the low level, and the potential of the node ND is slightly decreased and is changed from the potential Va to the potential Va'. However, in one embodiment of the present invention, the change in the potentials of the nodes FD and ND is canceled by returning the potential of the wiring W2 from the low level to the high level at time T4, and the potential of the node FD after time T4 is extremely close to the potential Va.

In other words, the oscillation frequency fvco of the output signal $f_{out}$ of the oscillator circuit 20 becomes the oscillation frequency fa after time T4, and can be kept at an oscillation frequency equivalent to the oscillation frequency at a timing when the frequency is locked at time T2.

In one embodiment of the present invention, after the oscillation frequency fvco of the output signal $f_{out}$ of the oscillator circuit 20 is locked to the oscillation frequency fa, the potential of the node FD of the semiconductor device 10 is kept, whereby the oscillation frequency fvco of the output signal $f_{out}$ does not always need to be adjusted. Thus, by the time when the oscillation frequency fvco is readjusted after locked, the phase comparator PC, the frequency divider FRD, and the charge pump CP can be kept in an off state. In the case where the phase comparator PC, the frequency divider FRD, and the charge pump CP are off, the potential Vcnf of the wiring WD is at the low level and the potential of the node FD of the semiconductor device 10 is held, so that the oscillation frequency fvco of the output signal $f_{out}$ of the oscillator circuit 20 can be kept locked to the oscillation frequency fa. The power consumption of the PLL 21 can be reduced with the above structure of one embodiment of the present invention.

This embodiment can be implemented in appropriate combinations with any of the other embodiments.

(Embodiment 4)

An example of a structure of the semiconductor device 10 is described with reference to FIG. 15.

Figure 15:
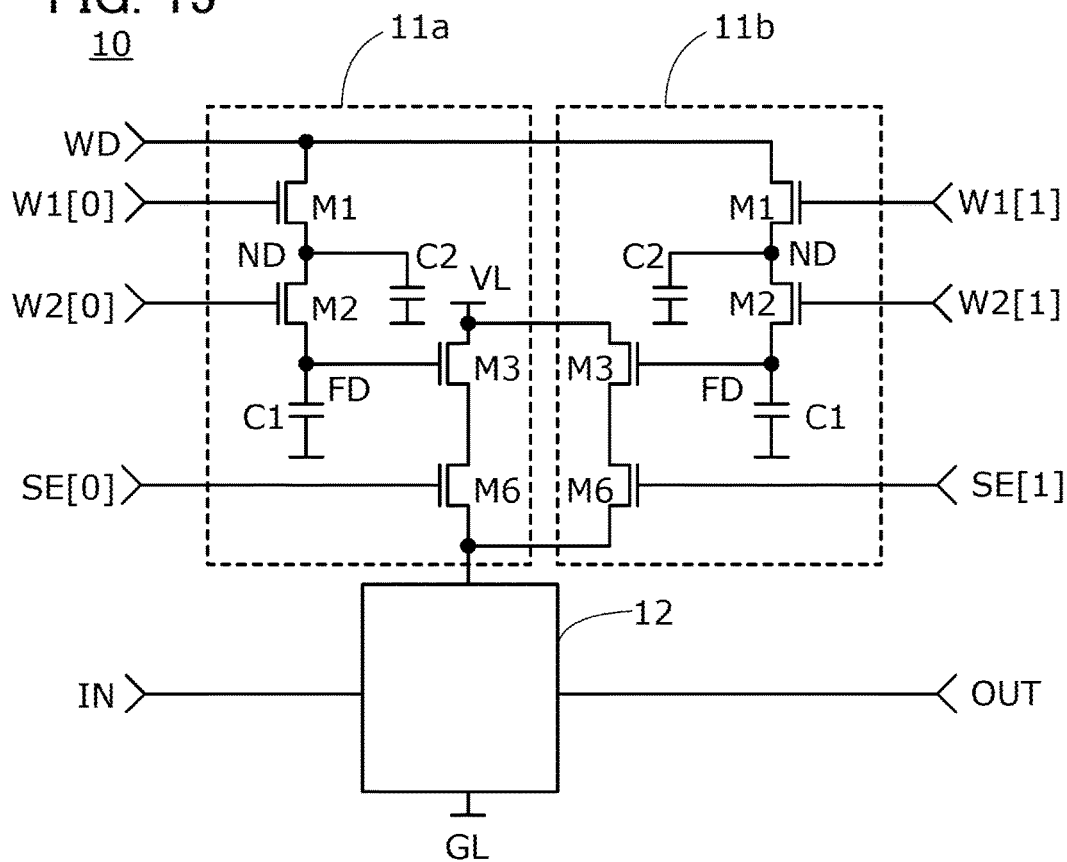
FIG. 15 illustrates an example of a structure of a semiconductor device.

In the semiconductor device 10 illustrated in FIG. 15, a plurality of first circuits 11 is electrically connected to one second circuit 12. Specifically, the semiconductor device 10 illustrated in FIG. 15 includes a first circuit 11a, a first circuit 11b, and the second circuit 12. The first circuits 11a and 11b are electrically connected to the second circuit 12.

The first circuits 11a and 11b in the semiconductor device 10 illustrated in FIG. 15 each have a structure similar to that of the first circuit 11 in the semiconductor device 10 illustrated in FIG. 9A. Specifically, the first circuits 11a and 11b illustrated in FIG. 15 each include the transistors M1 to M3 and M6.

The one of the source and the drain of the transistor M1 of the first circuit 11a and the one of the source and the drain of the transistor M1 of the first circuit 11b are electrically connected to the wiring WD. The gate of the transistor M1 of the first circuit 11a is electrically connected to a wiring W1[0], and the gate of the transistor M1 of the first circuit 11b is electrically connected to a wiring W1[1].

The gate of the transistor M2 of the first circuit 11a is electrically connected to a wiring W2[0], and the gate of the transistor M2 of the first circuit 11b is electrically connected to a wiring W2[1]. The one of the source and the drain of the transistor M3 of the first circuit 11a and the one of the source and the drain of the transistor M3 of the first circuit 11b are electrically connected to the wiring VL.

The gate of the transistor M6 of the first circuit 11a is electrically connected to a wiring SE[0], and the gate of the transistor M6 of the first circuit 11b is electrically connected to a wiring SE[1]. The other of the source and the drain of the transistor M6 of the first circuit 11a and the other of the source and the drain of the transistor M6 of the first circuit 11b are electrically connected to each other and further to the second circuit 12.

In the semiconductor device 10 illustrated in FIG. 15, the node FD of the first circuit 11a and the node FD of the first circuit 11b can hold different potentials Vcnf. Thus, the signal delay time in the second circuit 12 can be switched by choosing either the potential Vcnf of the node FD of the first circuit 11a or the potential Vcnf of the node FD of the first circuit 11b. In the case where the semiconductor device 10 illustrated in FIG. 15 is used for the oscillator circuit 20, the oscillation frequency of the signal output from the oscillator circuit 20 can be switched by choosing either the potential Vcnf of the node FD of the first circuit 11a or the potential Vcnf of the node FD of the first circuit 11b.

Figure 16:
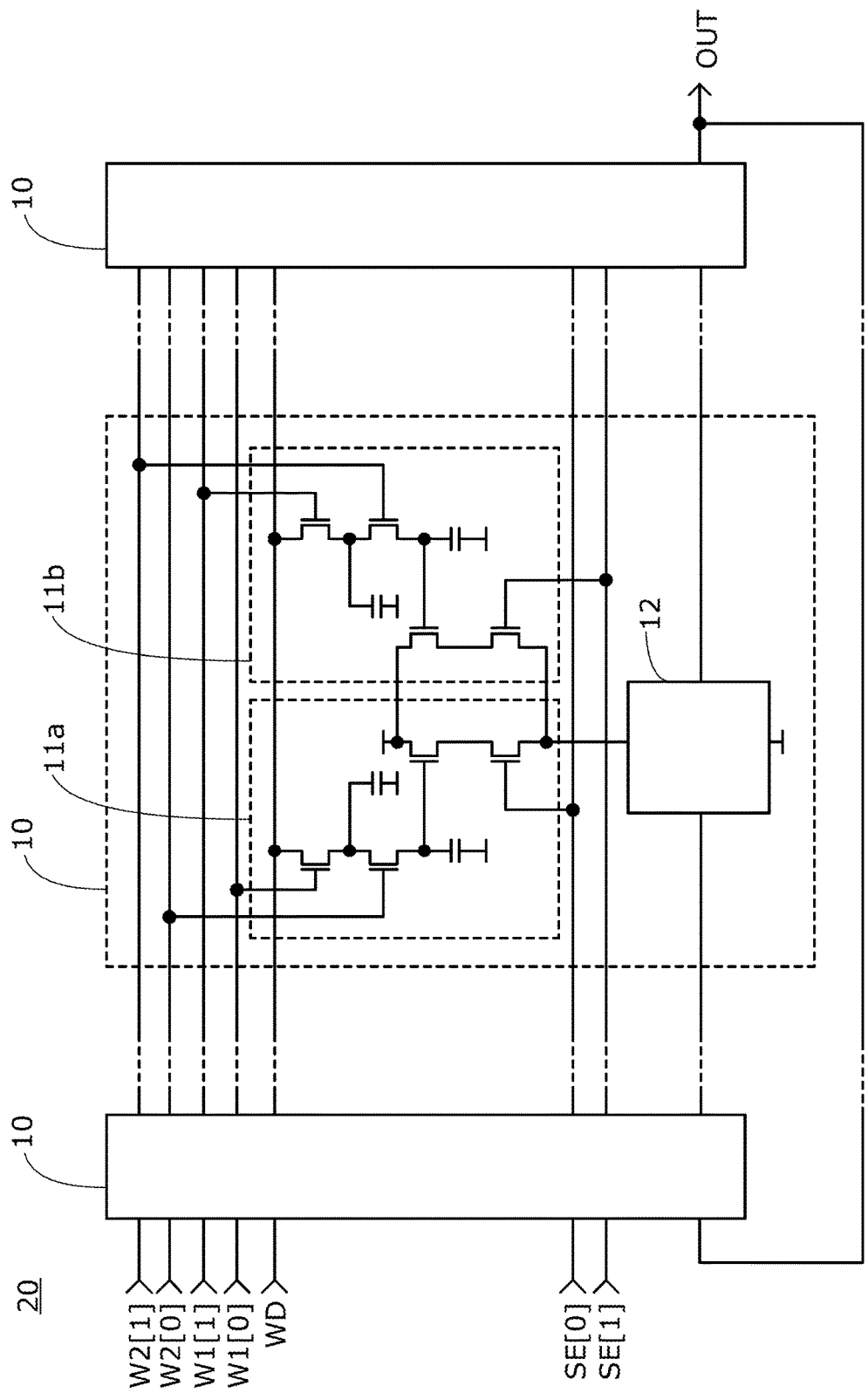
FIG. 16 illustrates an example of a structure of an oscillator circuit.

FIG. 16 illustrates an example of a structure of the oscillator circuit 20 including the n semiconductor devices 10 illustrated in FIG. 15. Note that n is an odd number. The n semiconductor devices 10 are circularly and electrically connected to each other such that a signal output from an output terminal of one semiconductor device 10 is input to an input terminal of the following semiconductor device 10. A signal output from the output terminal of the semiconductor device 10 in the last stage is input to the input terminal of the semiconductor device 10 in the first stage and also to the output terminal (OUT) of the oscillator circuit 20. The case where the wirings W1[0], W1[1], W2[0], W2[1], WD, SE[0], and SE[1] are electrically connected to all the semiconductor devices 10 is illustrated as an example.

Specifically, when the potential of the wiring SE[0] is at the high level and the potential of the wiring SE[1] is at the low level, the transistor M6 of the first circuit 11a of the first circuits 11a and 11b is turned on. Thus, the oscillation frequency of the output signal $f_{out}$ of the oscillator circuit 20 is determined by the potential Vcnf of the node FD of the first circuit 11a. In contrast, when the potential of the wiring SE[0] is at the low level and the potential of the wiring SE[1] is at the high level, the transistor M6 of the first circuit 11b of the first circuits 11a and 11b is turned on. Thus, the oscillation frequency of the output signal $f_{out}$ of the oscillator circuit 20 is determined by the potential Vcnf of the node FD of the first circuit 11b.

Next, an example of a structure of the semiconductor device 10 is described with reference to FIG. 17.

Figure 17:
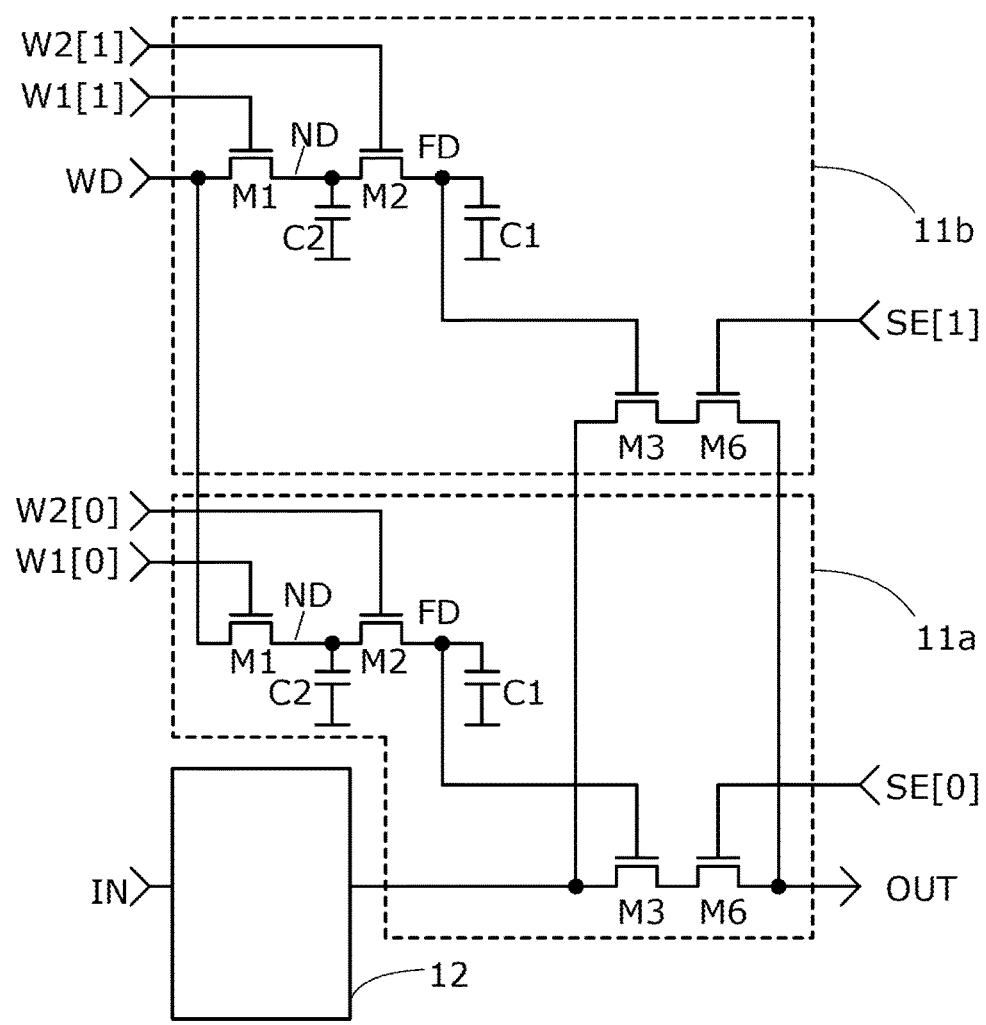
FIG. 17 illustrates an example of a structure of a semiconductor device.

In the semiconductor device 10 illustrated in FIG. 17, a plurality of first circuits 11 is electrically connected to one second circuit 12. Specifically, the semiconductor device 10 illustrated in FIG. 17 includes the first circuit 11a, the first circuit 11b, and the second circuit 12. The first circuits 11a and 11b are electrically connected to the second circuit 12.

The first circuits 11a and 11b in the semiconductor device 10 illustrated in FIG. 17 each have a structure similar to that of the first circuit 11 in the semiconductor device 10 illustrated in FIG. 11. Specifically, the first circuits 11a and 11b illustrated in FIG. 17 each include the transistors M1 to M3 and M6.

The one of the source and the drain of the transistor M1 of the first circuit 11a and the one of the source and the drain of the transistor M1 of the first circuit 11b are electrically connected to the wiring WD. The gate of the transistor M1 of the first circuit 11a is electrically connected to the wiring W1[0], and the gate of the transistor M1 of the first circuit 11b is electrically connected to the wiring W1[1].

The gate of the transistor M2 of the first circuit 11a is electrically connected to the wiring W2[0], and the gate of the transistor M2 of the first circuit 11b is electrically connected to the wiring W2[1]. The one of the source and the drain of the transistor M3 of the first circuit 11a and the one of the source and the drain of the transistor M3 of the first circuit 11b are electrically connected to each other and further to the output terminal of the second circuit 12.

The gate of the transistor M6 of the first circuit 11a is electrically connected to the wiring SE[0], and the gate of the transistor M6 of the first circuit 11b is electrically connected to the wiring SE[1]. The other of the source and the drain of the transistor M6 of the first circuit 11a and the other of the source and the drain of the transistor M6 of the first circuit 11b are electrically connected to each other and further to the output terminal (OUT) of the semiconductor device 10.

In the semiconductor device 10 illustrated in FIG. 17, the node FD of the first circuit 11a and the node FD of the first circuit 11b can hold different potentials Vcnf. Thus, the signal delay time in the second circuit 12 can be switched by choosing either the potential Vcnf of the node FD of the first circuit 11a or the potential Vcnf of the node FD of the first circuit 11b. In the case where the semiconductor device 10 illustrated in FIG. 17 is used for the oscillator circuit 20, the oscillation frequency of the signal output from the oscillator circuit 20 can be switched by choosing either the potential Vcnf of the node FD of the first circuit 11a or the potential Vcnf of the node FD of the first circuit 11b.

Figure 18:
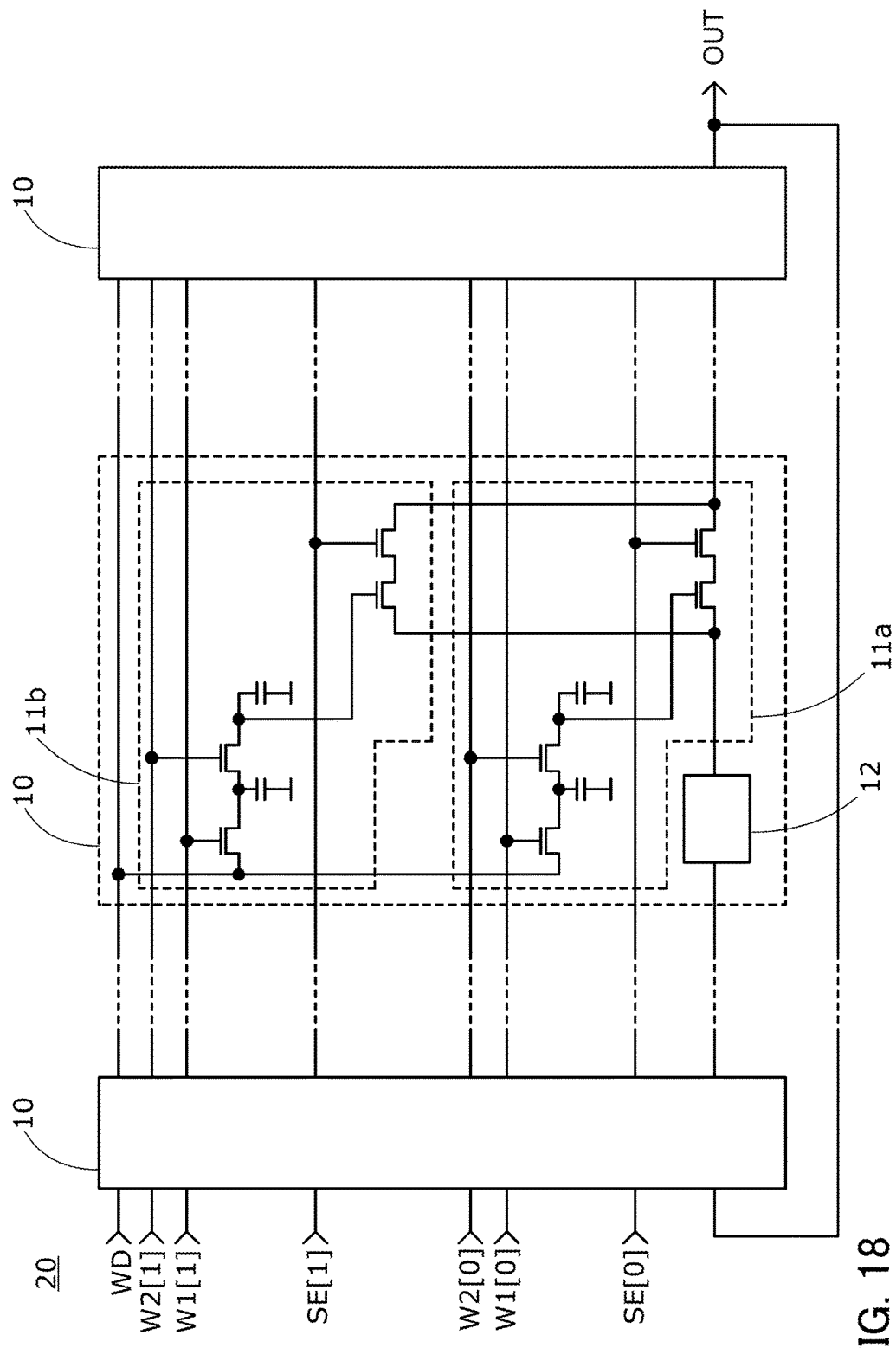
FIG. 18 illustrates an example of a structure of an oscillator circuit.

FIG. 18 illustrates an example of a structure of the oscillator circuit 20 including the n semiconductor devices 10 illustrated in FIG. 17. Note that n is an odd number. The n semiconductor devices 10 are circularly and electrically connected to each other such that a signal output from an output terminal of one semiconductor device 10 is input to an input terminal of the following semiconductor device 10. A signal output from the output terminal of the semiconductor device 10 in the last stage is input to the input terminal of the semiconductor device 10 in the first stage and also to the output terminal (OUT) of the oscillator circuit 20. The case where the wirings W1[0], W1[1], W2[0], W2[1], WD, SE[0], and SE[1] are electrically connected to all the semiconductor devices 10 is illustrated as an example.

Specifically, when the potential of the wiring SE[0] is at the high level and the potential of the wiring SE[1] is at the low level, the transistor M6 of the first circuit 11a of the first circuits 11a and 11b is turned on. Thus, the oscillation frequency of the output signal $f_{out}$ of the oscillator circuit 20 is determined by the potential Vcnf of the node FD of the first circuit 11a. In contrast, when the potential of the wiring SE[0] is at the low level and the potential of the wiring SE[1] is at the high level, the transistor M6 of the first circuit 11b of the first circuits 11a and 11b is turned on. Thus, the oscillation frequency of the output signal $f_{out}$ of the oscillator circuit 20 is determined by the potential Vcnf of the node FD of the first circuit 11b.

This embodiment can be implemented in appropriate combinations with any of the other embodiments.

(Embodiment 5)

An example of an oscillator circuit of one embodiment of the present invention using the semiconductor device 10 is described with reference to FIG. 19.

Figure 19:
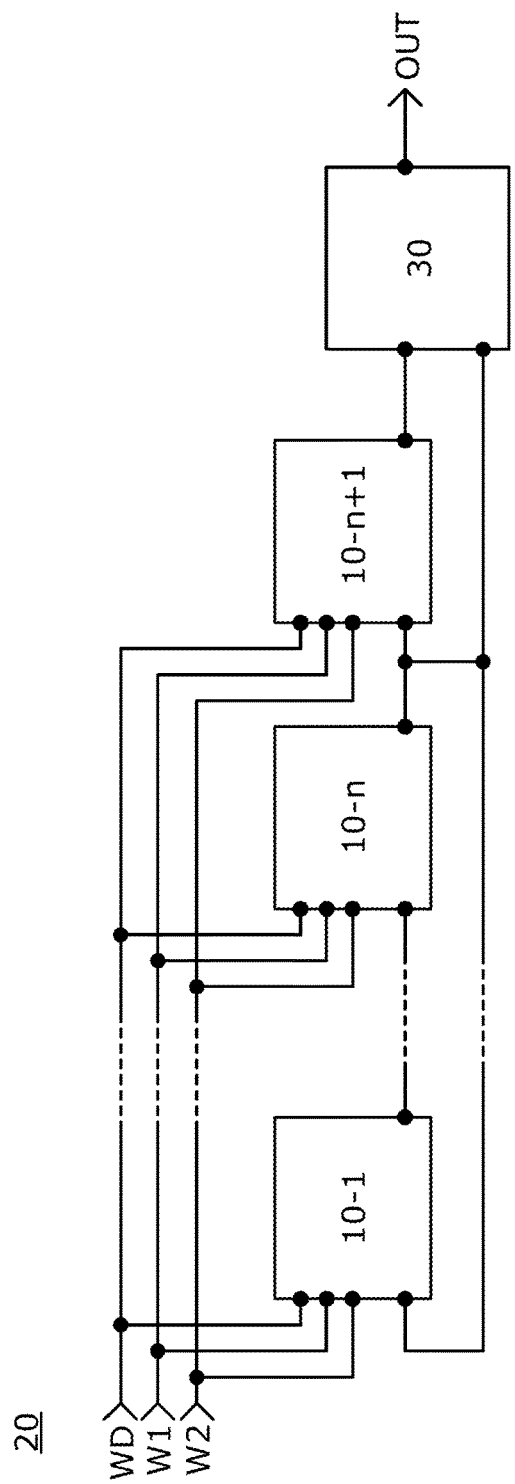
FIG. 19 illustrates an example of a structure of an oscillator circuit.

The oscillator circuit 20 illustrated in FIG. 19 includes the n+1 semiconductor devices 10 (10-1 to 10-n+1) and the circuit 30. Note that n is an odd number. As described above, the semiconductor device 10 includes the first circuit 11 and the second circuit 12.

The semiconductor devices 10-1 to 10-n+1 are electrically connected to the wirings WD, W1, and W2. FIG. 19 illustrates an example of the case where the semiconductor devices 10 each include one first circuit 11 and one second circuit 12 and the semiconductor devices 10-1 to 10-n+1 are electrically connected to the wirings WD, W1, and W2. However, in the case where the semiconductor devices 10 each include a plurality of first circuits 11 and one second circuit 12, the numbers of the wirings W1 and W2 can be set depending on the number of the first circuits 11.

Although one wiring WD is electrically connected to the semiconductor devices 10-1 to 10-n+1 in the oscillator circuit 20 illustrated in FIG. 19, at least one of the semiconductor devices 10-1 to 10-n+1 may be electrically connected to a different wiring WD from the wiring WD to which the other semiconductor devices 10 are electrically connected. In this case, a potential Vcnf that is different from the potential Vcnf supplied to the other semiconductor devices 10 can be written to the semiconductor device 10 electrically connected to the different wiring WD from the wiring WD to which the other semiconductor devices 10 are electrically connected.

The semiconductor devices 10-1 to 10-n in the oscillator circuit 20 illustrated in FIG. 19 are circularly and electrically connected to each other such that a signal output from an output terminal of one semiconductor device 10 is input to an input terminal of the following semiconductor device 10. A signal output from the output terminal of the semiconductor device 10-n is input to the input terminal of the semiconductor device 10-1 and also to the input terminal of the semiconductor device 10-n+1 and a second input terminal of the circuit 30. A signal output from an output terminal of the semiconductor device 10-n+1 is supplied to a first input terminal of the circuit 30.

The circuit 30 has a function of adjusting amplitudes or potential levels of the signals input from the input terminals. A level-shift circuit can be used as the circuit 30, for example. In the case where a NOT gate such as an inverter is used as the second circuit 12 in the semiconductor device 10-n+1, an input signal whose potential level is inversion of a potential level of the input signal of the second input terminal is supplied to the first input terminal in the circuit 30. The circuit 30 of the oscillator circuit 20 has a function of adjusting amplitudes or potential levels of the input signals of the first and second input terminals. Note that an output signal obtained by adjusting the amplitude or the potential level of the input signal of the second input terminal is output from the output terminal of the circuit 30 illustrated in FIG. 19. The output signal output from the output terminal of the circuit 30 can be regarded as a signal output from the output terminal (OUT) of the oscillator circuit 20.

The oscillator circuit 20 may have a structure in which the output signal of the circuit 30 is output from the output terminal (OUT) of the oscillator circuit 20 through a buffer circuit.

Figure 30:
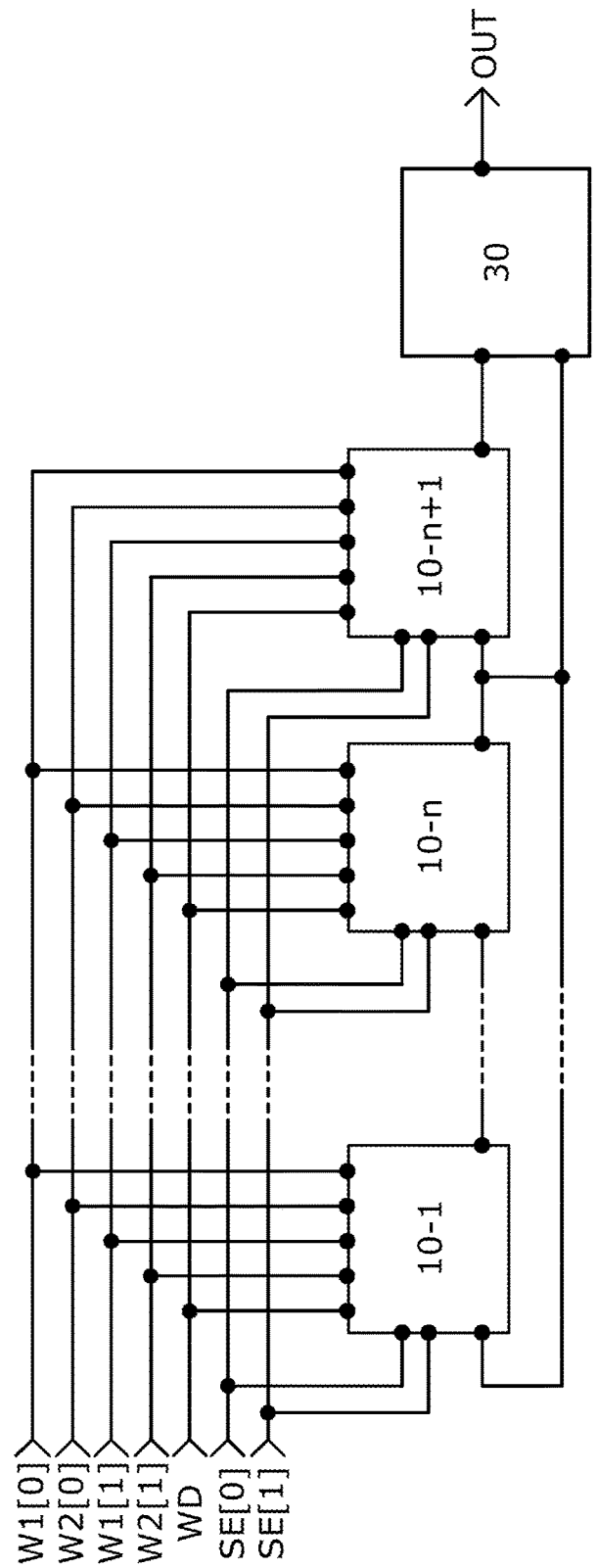
FIG. 30 illustrates an example of a structure of an oscillator circuit.

FIG. 30 illustrates an example of a connection relation of wirings in the oscillator circuit 20 illustrated in FIG. 19 in the case where the semiconductor devices 10 each include a plurality of first circuits 11 and one second circuit 12. FIG. 30 illustrates an example of the case where the wirings W1[0], W2[0], W1[1], W2[1], SE[0], SE[1], and WD are electrically connected to each of the semiconductor devices 10-1 to 10-n+1 when the semiconductor devices 10 each include two first circuits 11.

An example of an oscillator circuit of one embodiment of the present invention using the semiconductor device 10 is described with reference to FIG. 20.

Figure 20:
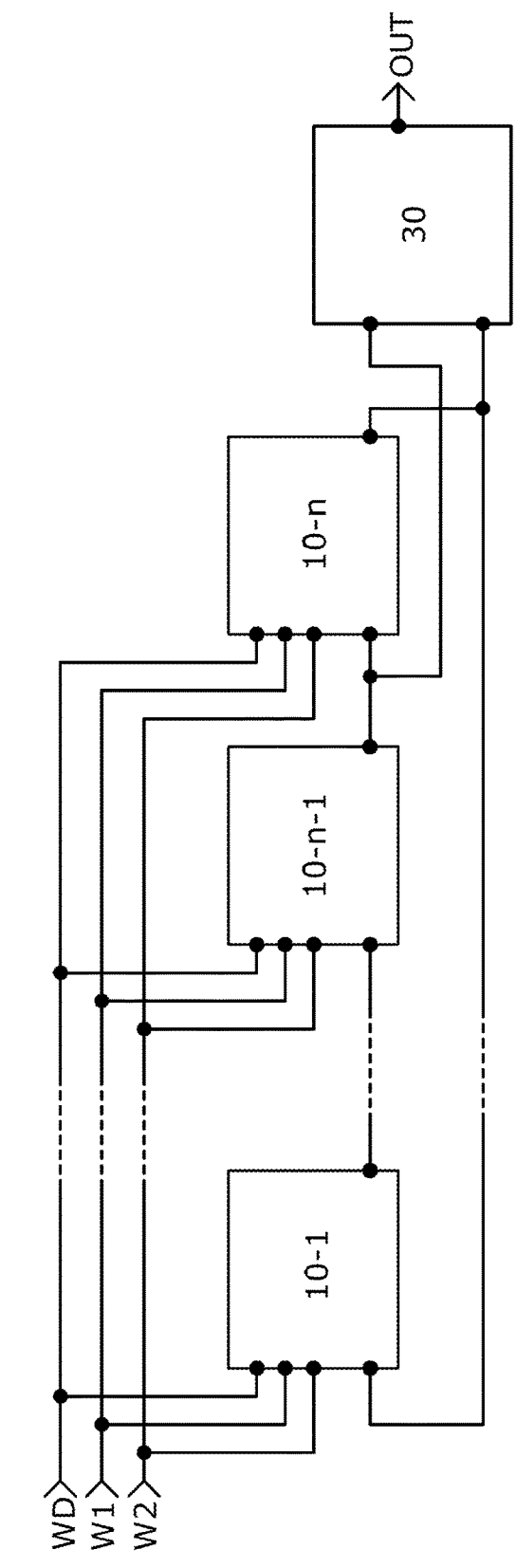
FIG. 20 illustrates an example of a structure of an oscillator circuit.

The oscillator circuit 20 illustrated in FIG. 20 includes the n semiconductor devices 10 (10-1 to 10-n) and the circuit 30. Note that n is an odd number. As described above, the semiconductor device 10 includes the first circuit 11 and the second circuit 12.

The semiconductor devices 10-1 to 10-n are electrically connected to the wirings WD, W1, and W2. FIG. 20 illustrates an example of the case where the semiconductor devices 10 each include one first circuit 11 and one second circuit 12 and the semiconductor devices 10-1 to 10-n are electrically connected to the wirings WD, W1, and W2. However, in the case where the semiconductor devices 10 each include a plurality of first circuits 11 and one second circuit 12, the numbers of the wirings W1 and W2 can be set depending on the number of the first circuits 11.

Although one wiring WD is electrically connected to the semiconductor devices 10-1 to 10-n in the oscillator circuit 20 illustrated in FIG. 20, at least one of the semiconductor devices 10-1 to 10-n may be electrically connected to a different wiring WD from the wiring WD to which the other semiconductor devices 10 are electrically connected. In this case, a potential Vcnf that is different from the potential Vcnf supplied to the other semiconductor devices 10 can be written to the semiconductor device 10 electrically connected to the different wiring WD from the wiring WD to which the other semiconductor devices 10 are electrically connected.

The semiconductor devices 10-1 to 10-n in the oscillator circuit 20 illustrated in FIG. 20 are circularly and electrically connected to each other such that a signal output from an output terminal of one semiconductor device 10 is input to an input terminal of the following semiconductor device 10. A signal output from the output terminal of the semiconductor device 10-n is input to the input terminal of the semiconductor device 10-1 and also to the second input terminal of the circuit 30. A signal output from the output terminal of the semiconductor device 10-n−1 is supplied to the first input terminal of the circuit 30.

Like the circuit 30 of the oscillator circuit 20 illustrated in FIG. 19, the circuit 30 illustrated in FIG. 20 has a function of adjusting amplitudes or potential levels of the signals input from the input terminals. A level-shift circuit can be used as the circuit 30, for example. In the case where a NOT gate such as an inverter is used as the second circuit 12 of the semiconductor device 10-n, an input signal whose potential level is inversion of a potential level of the input signal of the second input terminal is supplied to the first input terminal in the circuit 30.

The oscillator circuit 20 may have a structure in which the output signal of the circuit 30 is output from the output terminal (OUT) of the oscillator circuit 20 through a buffer circuit.

Figure 31:
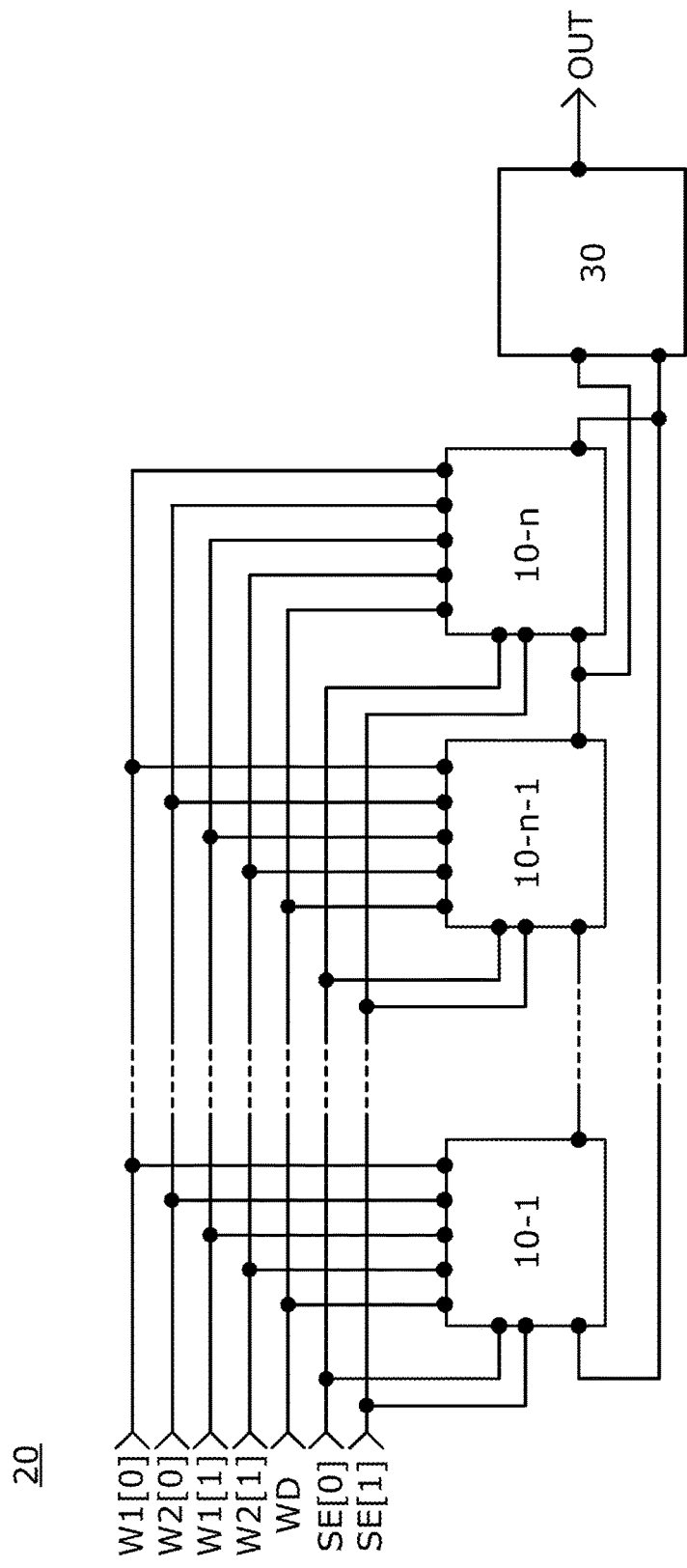
FIG. 31 illustrates an example of a structure of an oscillator circuit.

FIG. 31 illustrates an example of a connection relation of wirings in the oscillator circuit 20 illustrated in FIG. 20 in the case where the semiconductor devices 10 each include a plurality of first circuits 11 and one second circuit 12. FIG. 31 illustrates an example of the case where the wirings W1[0], W2[0], W1[1], W2[1], SE[0], SE[1], and WD are electrically connected to each of the semiconductor devices 10-1 to 10-n when the semiconductor devices 10 each include two first circuits 11.

An example of an oscillator circuit of one embodiment of the present invention using the semiconductor device 10 is described with reference to FIG. 21.

Figure 21:
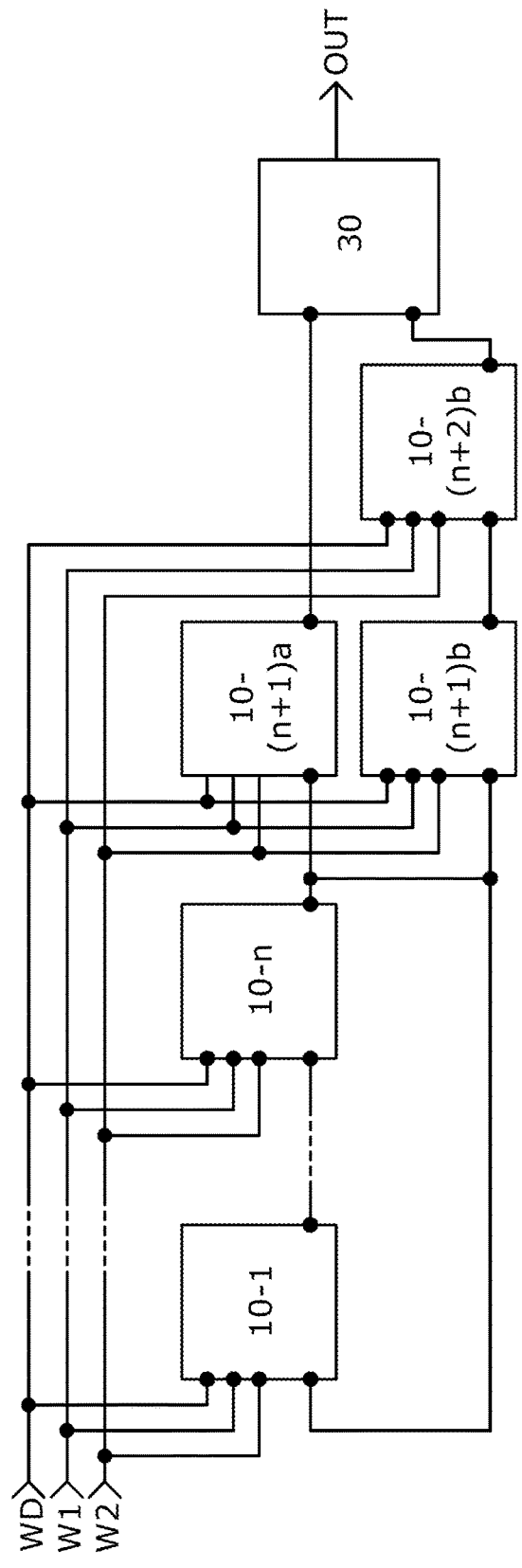
FIG. 21 illustrates an example of a structure of an oscillator circuit.

The oscillator circuit 20 illustrated in FIG. 21 includes the circuit 30 and the n+3 semiconductor devices 10 (10-1 to 10-n, 10-(n +1)a, 10-(n +1)b, and 10-(n +2)b). Note that n is an odd number. As described above, the semiconductor devices 10 each include the first circuit 11 and the second circuit 12.

The semiconductor devices 10-1 to 10-n, 10-(n +1)a, 10-(n +1)b, and 10-(n +2)b are electrically connected to the wirings WD, W1, and W2. FIG. 21 illustrates an example of the case where the semiconductor devices 10 each include one first circuit 11 and one second circuit 12 and the semiconductor devices 10-1 to 10-n, 10-(n +1)a, 10-(n +1)b, and 10-(n +2)b are electrically connected to the wirings WD, W1, and W2. However, in the case where the semiconductor devices 10 each include a plurality of first circuits 11 and one second circuit 12, the numbers of the wirings W1 and W2 can be set depending on the number of the first circuits 11.

Although one wiring WD is electrically connected to the semiconductor devices 10-1 to 10-n, 10-(n +1)a, 10-(n +1)b, and 10-(n +2)b in the oscillator circuit 20 illustrated in FIG. 21, at least one of the semiconductor devices 10-1 to 10-n, 10-(n +1)a, 10-(n +1)b, and 10-(n +2)b may be electrically connected to a different wiring WD from the wiring WD to which the other semiconductor devices 10 are electrically connected. In this case, a potential Vcnf that is different from the potential Vcnf supplied to the other semiconductor devices 10 can be written to the semiconductor device 10 electrically connected to the different wiring WD from the wiring WD to which the other semiconductor devices 10 are electrically connected.

The semiconductor devices 10-1 to 10-n in the oscillator circuit 20 illustrated in FIG. 21 are circularly and electrically connected to each other such that a signal output from an output terminal of one semiconductor device 10 is input to an input terminal of the following semiconductor device 10. A signal output from the output terminal of the semiconductor device 10-n is input to the input terminal of the semiconductor device 10-1 and also to an input terminal of the semiconductor device 10-(n +1)a and an input terminal of the semiconductor device 10-(n +1)b. A signal output from an output terminal of the semiconductor device 10-(n +1)a is supplied to the first input terminal of the circuit 30. A signal output from an output terminal of the semiconductor device 10-(n +1)b is supplied to an input terminal of the semiconductor device 10-(n +2)b. A signal output from an output terminal of the semiconductor device 10-(n +2)b is supplied to the second input terminal of the circuit 30.

Like the circuit 30 of the oscillator circuit 20 illustrated in FIG. 19, the circuit 30 illustrated in FIG. 21 has a function of adjusting amplitudes or potential levels of the signals input from the input terminals. A level-shift circuit can be used as the circuit 30, for example. In the case where a NOT gate such as an inverter is used as the second circuit 12 of each of the semiconductor devices 10-(n +1)a, 10-(n +1)b, and 10-(n +2)b, an input signal whose potential level is inversion of a potential level of the input signal of the second input terminal is supplied to the first input terminal in the circuit 30.

The oscillator circuit 20 may have a structure in which the output signal of the circuit 30 is output from the output terminal (OUT) of the oscillator circuit 20 through a buffer circuit.

Figure 32:
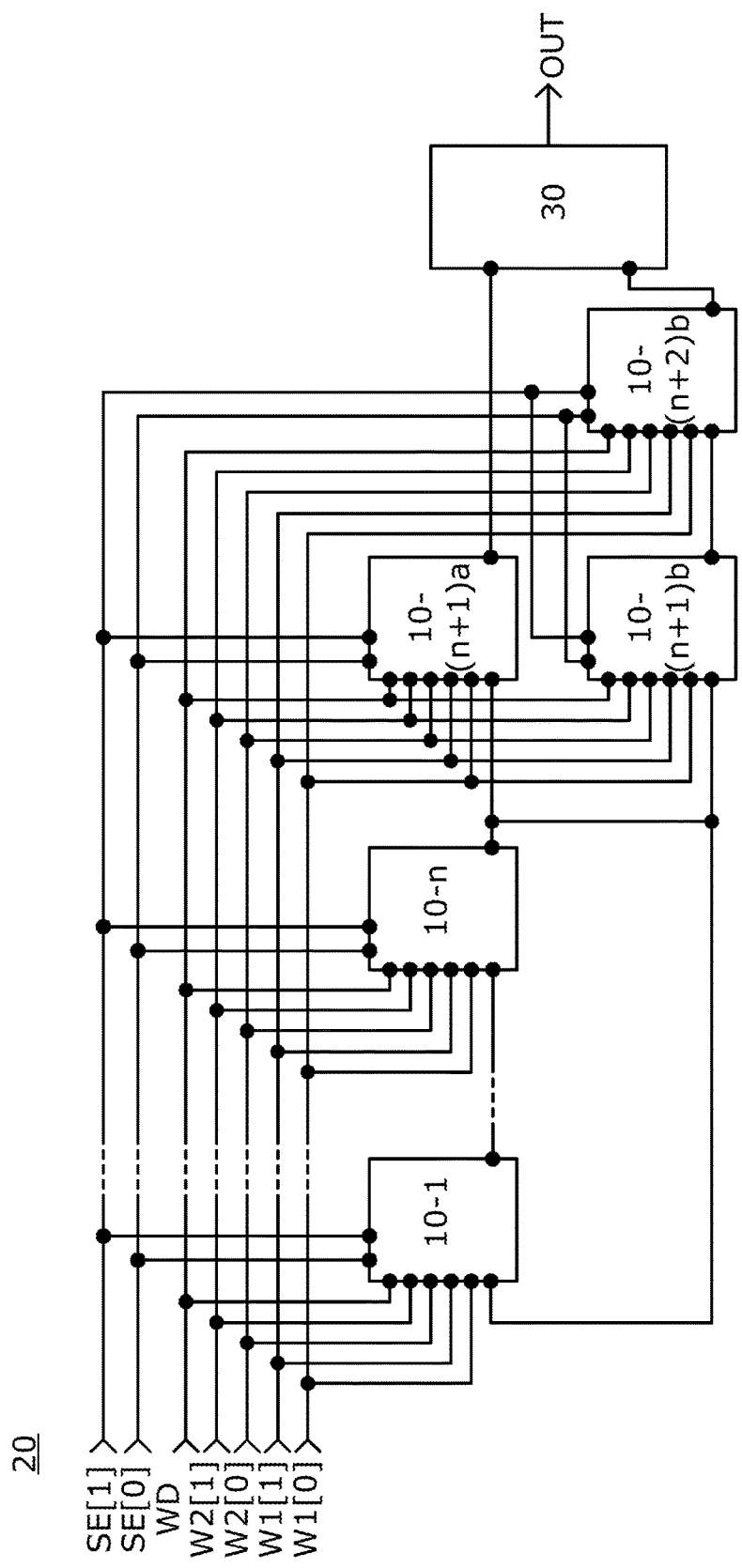
FIG. 32 illustrates an example of a structure of an oscillator circuit.

FIG. 32 illustrates an example of a connection relation of wirings in the oscillator circuit 20 illustrated in FIG. 21 in the case where the semiconductor devices 10 each include a plurality of first circuits 11 and one second circuit 12. FIG. 32 illustrates an example of the case where the wirings W1[0], W2[0], W1[1], W2[1], SE[0], SE[1], and WD are electrically connected to each of the semiconductor devices 10-1 to 10-n, 10-(n +1)a, 10-(n +1)b, and 10-(n +2)b when the semiconductor devices 10 each include two first circuits 11.

Figure 33:
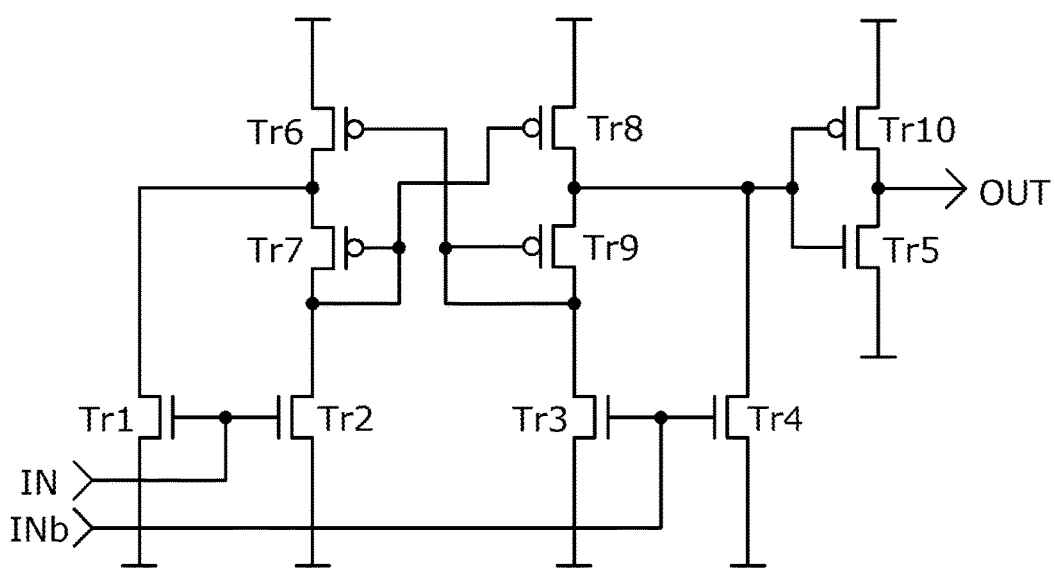
FIG. 33 illustrates an example of a structure of a circuit 30.

FIG. 33 illustrates an example of a structure of the circuit 30. The circuit 30 illustrated in FIG. 33 includes n-channel transistors Tr1 to Tr5 and p-channel transistors Tr6 to Tr10.

Gates of the transistors Tr1 and Tr2 are electrically connected to the input terminal IN, and gates of the transistors Tr3 and Tr4 are electrically connected to an input terminal INb. A potential of a signal supplied to the input terminal INb corresponds to a potential whose polarity is opposite to a polarity of a potential of a signal supplied to the input terminal IN. One of a source and a drain of each of the transistors Tr1 to Tr5 is electrically connected to a wiring supplied with a predetermined potential. The other of the source and the drain of the transistor Tr1 is electrically connected to one of a source and a drain of each of the transistors Tr6 and Tr7. The other of the source and the drain of the transistor Tr2 is electrically connected to the other of the source and the drain of the transistor Tr7. The other of the source and the drain of the transistor Tr4 is electrically connected to one of a source and a drain of each of the transistors Tr8 and Tr9. The other of the source and the drain of the transistor Tr3 is electrically connected to the other of the source and the drain of the transistor Tr9. A gate of the transistor Tr6 is electrically connected to a gate and the other of the source and the drain of the transistor Tr9. A gate of the transistor Tr8 is electrically connected to a gate and the other of the source and the drain of the transistor Tr7. A gate of the transistor Tr10 is electrically connected to a gate of the transistor Tr5 and the other of the source and the drain of the transistor Tr4. The other of the source and the drain of the transistor Tr5 is electrically connected to one of a source and a drain of the transistor Tr10, and a potential of the other of the source and the drain of the transistor Tr5 is supplied to the output terminal OUT. The other of the source and the drain of each of the transistors Tr6, Tr8, and Tr10 is electrically connected to a wiring supplied with a predetermined potential.

This embodiment can be implemented in appropriate combinations with any of the other embodiments.

(Embodiment 6)

An example of a top view illustrating the transistors M1 and M2 of the first circuit 11 is described with reference to FIG. 22.

As illustrated in FIG. 5, each of the transistors M1 and M2 has capacitance between the gate and the source and between the gate and the drain. Specifically, in FIG. 5, the capacitance between the gate and the one of the source and the drain of the transistor M1 is Ca, the capacitance between the gate and the other of the source and the drain of the transistor M1 is Cb, the capacitance between the gate and the one of the source and the drain of the transistor M2 is Cc, and the capacitance between the gate and the other of the source and the drain of the transistor M2 is Cd. As the value of Cb and the value of Cc are closer to each other, the change in the potential of the node ND can be almost canceled.

In order that Cb and Cc have the same value or close values, a positional relation between the gate electrode and the other of the source electrode and the drain electrode of the transistor M1 should be equivalent to a positional relation between the gate electrode and the one of the source electrode and the drain electrode of the transistor M2. Note that the other of the source electrode and the drain electrode of the transistor M1 is electrically connected to the one of the source electrode and the drain electrode of the transistor M2.

Figure 22:
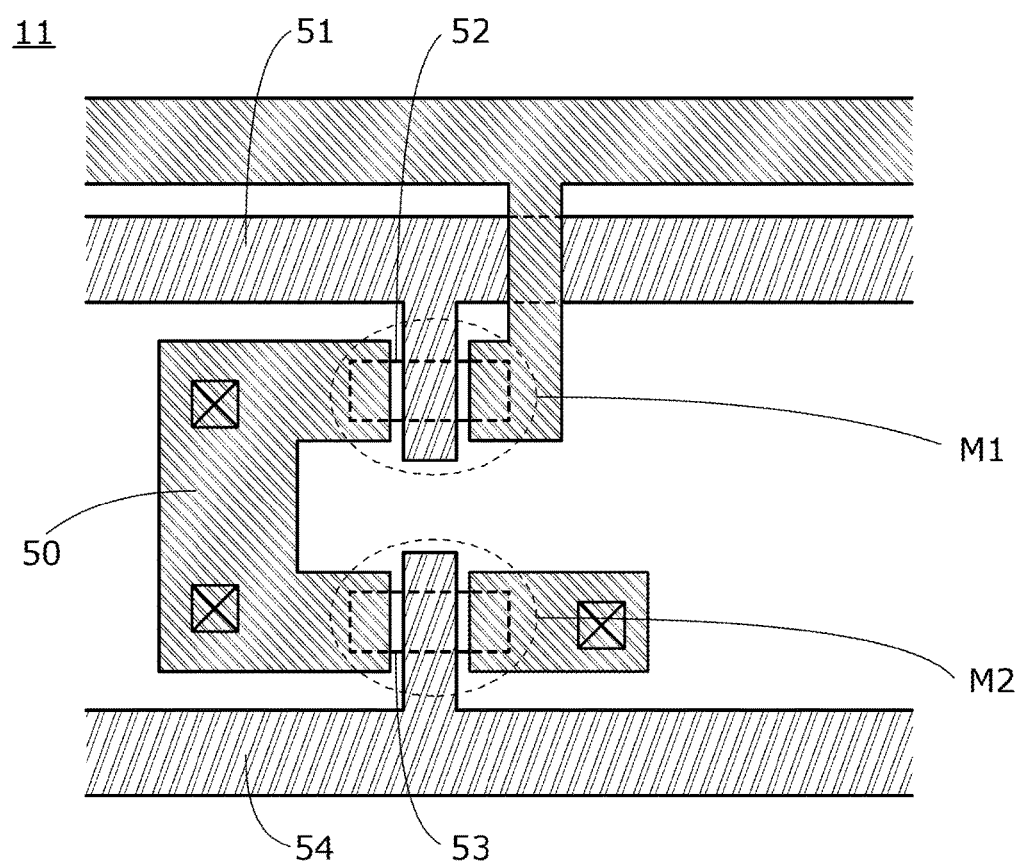
FIG. 22 illustrates an example of a layout of transistors.

Specifically, in FIG. 22, a conductive film 50 functions as the other of the source electrode and the drain electrode of the transistor M1. A conductive film 51 functions as the gate electrode of the transistor M1. A region of a semiconductor layer 52, which overlaps with the conductive film 50, is positioned on the left side of a region of the semiconductor layer 52, which overlaps with the conductive film 51 (and also functions as a channel formation region). In FIG. 22, the conductive film 50 also functions as the one of the source electrode and the drain electrode of the transistor M2. A conductive film 54 functions as the gate electrode of the transistor M2. A region of a semiconductor layer 53, which overlaps with the conductive film 50, is positioned on the left side of a region of the semiconductor layer 53, which overlaps with the conductive film 54 (and also functions as a channel formation region).

With the structure illustrated in FIG. 22, even when the conductive film 50 is misaligned due to mask misalignment or the like in formation of the conductive film 50, the capacitance (Cb) formed between the conductive film 50 and the conductive film 51 and the capacitance (Cc) formed between the conductive film 50 and the conductive film 54 can have the same value. For example, even when the conductive film 50 deviates to the left from an appropriate position and the distance between the conductive film 50 and the conductive film 51 is increased, the distance between the conductive film 50 and the conductive film 54 is also increased to the same extent; thus, Cb and Cc can have the same value.

In order that Cb and Cc have the same value or close values, as illustrated in FIG. 22, an end portion of the semiconductor film in the channel width direction of the transistor M1 is preferably covered with the source electrode or the drain electrode. With this structure, even when the conductive film 50 is misaligned in the channel width direction to some extent due to mask misalignment or the like in formation of the conductive film 50, Cb and Cc can have the same value.

This embodiment can be implemented in appropriate combinations with any of the other embodiments.

(Embodiment 7)

Next, a structure example of a transistor with an oxide semiconductor will be described.

Figure 23A:
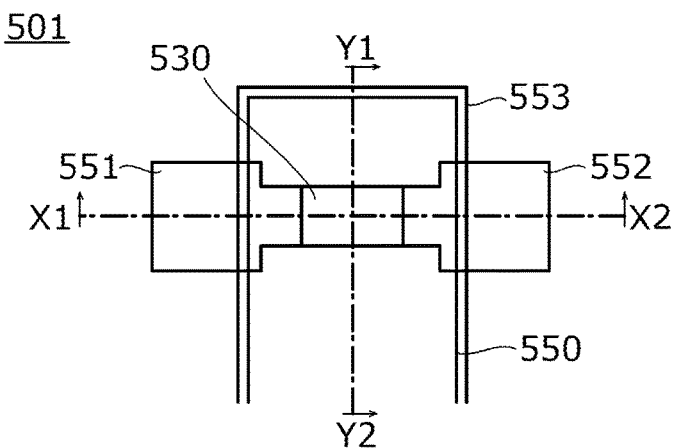
FIGS. 23A to 23C illustrate a structure of a transistor.
Figure 23B:
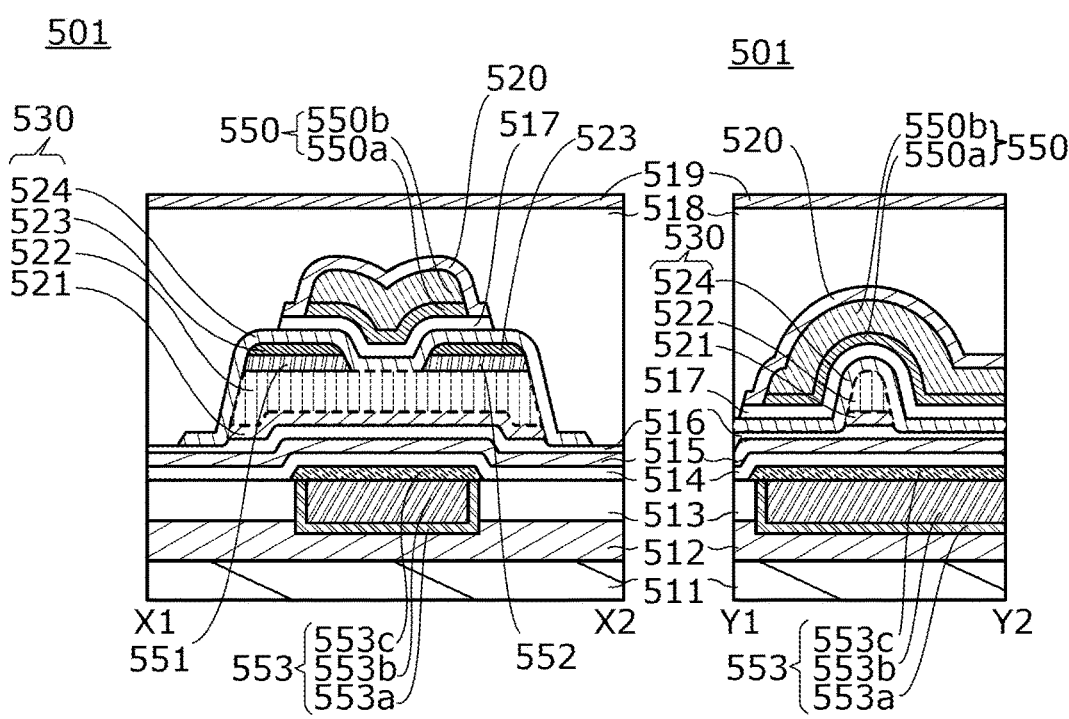
Figure 23C:
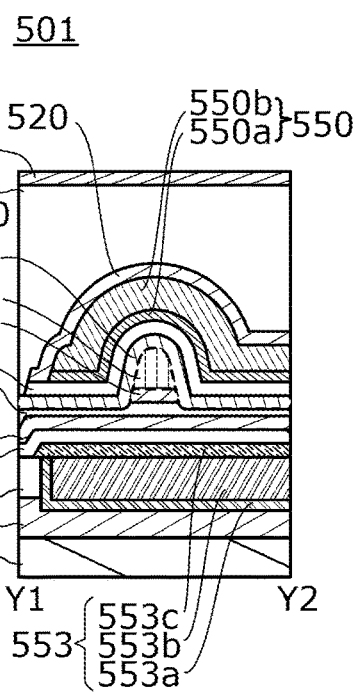

FIG. 23A is a top view illustrating a structure example of a transistor. FIG. 23B is a cross-sectional view taken along line X1-X2 in FIG. 23A, and FIG. 23C is a cross-sectional view taken along line Y1-Y2 in FIG. 23A. Here, the direction of the line X1-X2 may be referred to as a channel length direction, and the direction of the line Y1-Y2 may be referred to as a channel width direction. FIG. 23B illustrates a cross-sectional structure of the transistor in the channel length direction, and FIG. 23C illustrates a cross-sectional structure of the transistor in the channel width direction. Note that to clarify the device structure, FIG. 23A does not illustrate some components.

The semiconductor device of one embodiment of the present invention includes insulating layers 512 to 520, metal oxide films 521 to 524, and conductive layers 550 to 553. FIGS. 23A to 23C illustrate a case where a transistor 501 is formed over the insulating layer 511. The transistor 501 is covered by the insulating layers 518 and 519.

Note that the insulating layers, the metal oxide films, the conductive layers, or the like that constitute the transistor 501 may each be a single film, or a stack including a plurality of films. These films and layers can be formed by any of a variety of deposition methods such as sputtering, molecular beam epitaxy (MBE), pulsed laser ablation (PLA), chemical vapor deposition (CVD), and atomic layer deposition (ALD). Examples of CVD include plasma CVD, thermal CVD, and metal organic CVD.

The conductive layer 550 includes a region that functions as a gate electrode of the transistor 501. The conductive layers 551 and 552 include regions that function as a source electrode and a drain electrode. The conductive layer 553 includes a region that functions as a back gate electrode. The insulating layer 517 includes a region that functions as a gate insulating layer on the gate electrode (front gate electrode) side, and an insulating layer that is composed of the insulating layers 514 to 516 includes a region that functions as a gate insulating layer on the back gate electrode side. The insulating layer 518 can serve as an interlayer insulating layer. The insulating layer 519 can serve as a barrier layer.

The metal oxide films 521 to 524 will be collectively designated as an oxide layer 530. As illustrated in FIGS. 23B and 23C, the oxide layer 530 includes a region where the metal oxide film 521, the metal oxide film 522, and the metal oxide film 524 are stacked in that order. In addition, a pair of the metal oxide films 523 is positioned over the conductive layer 551 and the conductive layer 552. When the transistor 501 is on, a channel formation region is mainly formed in the metal oxide film 522 of the oxide layer 530.

The metal oxide film 524 covers the metal oxide films 521 to 523, the conductive layer 551, and the conductive layer 552. The insulating layer 517 is positioned between the metal oxide film 523 and the conductive layer 550. The conductive layers 551 and 552 each include a region that overlaps with the conductive layer 550 with the metal oxide film 523, the metal oxide film 524, and the insulating layer 517 positioned therebetween.

The conductive layers 551 and 552 are fabricated from a hard mask that is used in the formation of the metal oxide films 521 and 522. Thus, the conductive layers 551 and 552 do not include regions in contact with the side surfaces of the metal oxide films 521 and 522. For example, the metal oxide films 521 and 522 and the conductive layers 551 and 552 can be formed through the following steps. First, a conductive film is formed over a two-layered metal oxide film. The conductive film is processed (etched) into a desired shape, forming a hard mask. The hard mask is used to process the shape of the two-layered metal oxide film, forming the metal oxide films 521 and 522 that are stacked. Next, the hard mask is processed into a desired shape, forming the conductive layers 551 and 552.

Examples of insulating materials used for the insulating layers 511 to 518 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 511 to 518 are formed using a single-layer structure or a stacked-layer structure containing any of these insulating materials. The layers used for the insulating layers 511 to 518 may include a plurality of insulating materials.

Note that in this specification and the like, an oxynitride refers to a compound that contains more oxygen than nitrogen, and a nitride oxide refers to a compound that contains more nitrogen than oxygen.

The insulating layers 516 to 518 preferably contain oxygen to suppress the increase in oxygen vacancies in the oxide layer 530. Further preferably, the insulating layers 516 to 518 are each formed using an insulating film from which oxygen is released by heating. Note that in this specification and the like, oxygen released by heating is also referred to as excess oxygen. Since oxygen is supplied from the insulating film containing excess oxygen to the oxide layer 530, the oxygen vacancies in the oxide layer 530 can be compensated. The reliability and electrical characteristics of the transistor 501 can be improved.

The insulating layer containing excess oxygen is a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. The amount of released oxygen molecules is preferably more than or equal to $3.0 \times 10^{20}$ molecules/cm$^3$.

The insulating film containing excess oxygen can be formed by performing treatment for adding oxygen to an insulating film. The treatment for adding oxygen can be performed by heat treatment under an oxygen atmosphere, an ion implantation method, an ion doping method, a plasma immersion ion implantation method, plasma treatment, or the like. As a gas for adding oxygen, an oxygen gas of $^{16}O_2$, $^{18}O_2$, or the like, a nitrous oxide gas, an ozone gas, or the like can be used.

The hydrogen concentrations in the insulating layers 512 to 519 are preferably low in order to prevent an increase in the hydrogen concentration in the oxide layer 530. In particular, the hydrogen concentrations in the insulating layers 513 to 518 are preferably low. Specifically, the hydrogen concentration is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, and still further preferably lower than or equal to $5 \times 10^{18}$ atoms/cm$^3$.

The nitrogen concentrations in the insulating layers 513 to 518 are preferably low in order to prevent an increase in the nitrogen concentration in the oxide layer 530. Specifically, the nitrogen concentration is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

The hydrogen concentration and the nitrogen concentration described above are measured by secondary ion mass spectrometry (SIMS).

In the transistor 501, the oxide layer 530 is preferably surrounded by an insulating layer with oxygen and hydrogen barrier properties (hereinafter such an insulating layer is referred to as a barrier layer). A use of such a structure prevents release of oxygen from the oxide layer 530, and intrusion of hydrogen into the oxide layer 530. Thus, reliability and electrical characteristics of the transistor 501 can be improved.

For example, the insulating layer 519 functions as a barrier layer and at least one of the insulating layers 511, 512, and 514 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride.

A structure example of the insulating layers 511 to 518 is described. In this example, each of the insulating layers 511, 512, 515, and 519 functions as a barrier layer. The insulating layers 516 to 518 are oxide layers containing excess oxygen. The insulating layer 511 is formed using silicon nitride. The insulating layer 512 is formed using aluminum oxide. The insulating layer 513 is formed using silicon oxynitride. The insulating layers 514 to 516 that serve as the gate insulating layers on the back gate electrode side are formed using a stack including silicon oxide, aluminum oxide, and silicon oxide. The insulating layer 517 that serves as the gate insulating layer on the front gate electrode side is formed using silicon oxynitride. The insulating layer 518 that serves as the interlayer insulating layer is formed using silicon oxide. The insulating layer 519 is formed using aluminum oxide.

Examples of a conductive material used for the conductive layers 550 to 553 include a metal such as molybdenum, titanium, tantalum, tungsten, aluminum, copper, chromium, neodymium, or scandium; and a metal nitride containing any of the above metals as its component (tantalum nitride, titanium nitride, molybdenum nitride, or tungsten nitride). Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide can be used.

A structure example of the conductive layers 550 to 553 is described. The conductive layer 550 is a stack including a conductive layer 550a and a conductive layer 550b. For example, tantalum nitride can be used for the conductive layer 550a and tungsten can be used for the conductive layer 550b. The conductive layer 551 can be formed with a single layer of tungsten, a single layer of tantalum nitride, or a stack including tantalum nitride and tungsten. The structure of the conductive layer 552 is the same as that of the conductive layer 551. The conductive layer 553 is a stack including a conductive layer 553a, a conductive layer 553b, and a conductive layer 553c. For example, titanium nitride can be used for the conductive layer 553a, copper or tungsten can be used for the conductive layer 553b, and tantalum nitride can be used for the conductive layer 553c. The conductive layer 553c has a function of preventing oxidation of the conductive layer 553b. The conductive layer 553c also has a function of preventing an element contained in the conductive layer 553b from diffusing to the outside.

In order to reduce the off-state current of the transistor 501, for example, the energy gap of the metal oxide film 522 is preferably large. The energy gap of the metal oxide film 522 is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

The oxide layer 530 preferably exhibits crystallinity. At least the metal oxide film 522 preferably exhibits crystallinity. With the structure described above, the transistor 501 can have high reliability and favorable electrical characteristics.

As the oxide of the metal oxide film 522, typically, an In—Ga oxide, an In—Zn oxide, or an In—M—Zn oxide (M is Al, Ga, Y, or Sn) can be used. The metal oxide film 522 is not limited to the oxide layer containing indium. The metal oxide film 522 can be formed using a Zn—Sn oxide, a Ga—Sn oxide, or a Zn—Mg oxide, for example. The metal oxide films 521, 523 and 524 can be formed using an oxide that is similar to the oxide of the metal oxide film 522. In particular, each of the metal oxide films 521, 523 and 524 can be formed with Ga oxide.

When an interface level is formed at the interface between the metal oxide film 522 and the metal oxide film 521, a channel region is formed also in the vicinity of the interface, which causes a change in the threshold voltage of the transistor 501. It is preferable that the metal oxide film 521 contain at least one of the metal elements contained in the metal oxide film 522. Accordingly, an interface level is unlikely to be formed at the interface between the metal oxide film 522 and the metal oxide film 521, and variations in the electrical characteristics of the transistor 501, such as the threshold voltage can be reduced.

It is preferable that the metal oxide film 524 contain at least one of the metal elements contained in the metal oxide film 522 because interface scattering is unlikely to occur at the interface between the metal oxide film 522 and the metal oxide film 524, and carrier transfer is not inhibited. Thus, the field-effect mobility of the transistor 501 can be increased.

It is preferable that the metal oxide film 522 have the highest carrier mobility among the metal oxide films 521 to 524. Accordingly, a channel formation region can be formed in the metal oxide film 522 that is apart from the insulating layers 516 and 517.

For example, in a metal oxide containing indium such as an In—M—Zn oxide, carrier mobility can be increased by an increase in the indium content. Therefore, an oxide having a high content of indium is used for an oxide semiconductor film, so that carrier mobility can be increased.

Thus, for example, the metal oxide film 522 is formed using an In—Ga—Zn oxide, and the metal oxide films 521 and 523 are formed using a Ga oxide. For example, when the metal oxide films 521 to 523 are formed using an In—M—Zn oxide, the indium content of the metal oxide film 522 is made higher than the indium content of the metal oxide films 521 and 523. When the In—M—Zn oxide is formed by sputtering, the indium content can be changed by a change in the atomic ratio of metal elements of a target.

For example, it is preferable that the atomic ratio of metal elements of a target used for depositing the metal oxide film 522 be In:M:Zn=1:1:1, 3:1:2, or 4:2:4.1. For example, it is preferable that the atomic ratio of metal elements of a target used for depositing the metal oxide films 521 and 523 be In:M:Zn=1:3:2 or 1:3:4. The atomic ratio of an In—M—Zn oxide deposited using a target of In:M:Zn=4:2:4.1 is approximately InM:Zn=4:2:3.

For the transistor 501 to have stable electrical characteristics, it is preferable to reduce the concentration of impurities in the oxide layer 530. In the metal oxide, hydrogen, nitrogen, carbon, silicon, and a metal element other than a main component are impurities. For example, hydrogen and nitrogen form donor levels to increase the carrier density, and silicon and carbon form impurity levels in the metal oxide. The impurity levels serve as traps and might cause deterioration of electrical characteristics of the transistor.

For example, the oxide layer 530 includes a region where the concentration of silicon is lower than or equal to $2 \times 10^{18}$ atoms/cm$^3$, preferably lower than or equal to $2 \times 10^{17}$ atoms/cm$^3$. The same applies to the concentration of carbon in the oxide layer 530.

The oxide layer 530 includes a region where the concentration of alkali metal is lower than or equal to $1 \times 10^{18}$ atoms/cm$^3$, preferably lower than or equal to 2×10$^{16}$ atoms/cm$^3$. The same applies to the concentration of alkaline earth metal in the metal oxide film 522.

The oxide layer 530 includes a region where the concentration of nitrogen is lower than 5×10$^{19}$ atoms/cm$^3$, preferably lower than or equal to 5×10$^{18}$ atoms/cm$^3$, further preferably lower than or equal to 1×10$^{18}$ atoms/cm$^3$, still further preferably lower than or equal to 5×10$^{17}$ atoms/cm$^3$.

The oxide layer 530 includes a region where the concentration of hydrogen is lower than 1×10$^{20}$ atoms/cm$^3$, preferably lower than 1×10$^{19}$ atoms/cm$^3$, further preferably lower than 5×10$^{18}$ atoms/cm$^3$, still further preferably lower than 1×10$^{18}$ atoms/cm$^3$.

The above concentrations of the impurities in the oxide layer 530 are measured by SIMS.

In the case where the metal oxide film 522 contains oxygen vacancies, donor levels are formed by entry of hydrogen into sites of oxygen vacancies in some cases. Thus, the oxygen vacancies might decrease on-state current of the transistor 501 in some cases. Note that sites of oxygen vacancies become more stable by entry of oxygen than by entry of hydrogen. Thus, by reducing oxygen vacancies in the metal oxide film 522, the on-state current of the transistor 501 can be increased in some cases. Consequently, preventing entry of hydrogen into sites of oxygen vacancies by a reduction in hydrogen in the metal oxide film 522 is effective in increasing on-state current.

Hydrogen contained in a metal oxide reacts with oxygen bonded to a metal atom to be water, and thus causes an oxygen vacancy, in some cases. An electron serving as a carrier is generated due to entry of hydrogen into the oxygen vacancy, in some cases. Furthermore, in some cases, bonding of part of hydrogen to oxygen bonded to a metal atom causes generation of an electron serving as a carrier. Thus, the transistor 501 is likely to be normally on when the metal oxide film 522 contains hydrogen because the metal oxide film 522 includes a channel formation region. Accordingly, it is preferable that hydrogen in the metal oxide film 522 be reduced as much as possible.

FIGS. 23A to 23C illustrate an example in which the oxide layer 530 has a four-layer structure; however, one embodiment of the present invention is not limited thereto. For example, the oxide layer 530 can have a three-layer structure without the metal oxide film 521 or without the metal oxide film 523. Alternatively, the oxide layer 530 may include one or more metal oxide films that are similar to the metal oxide films 521 to 524 at two or more of the following positions: between given layers in the oxide layer 530, over the oxide layer 530, and below the oxide layer 530.

The transistor 501 does not necessarily include a back gate electrode.

Figure 25:
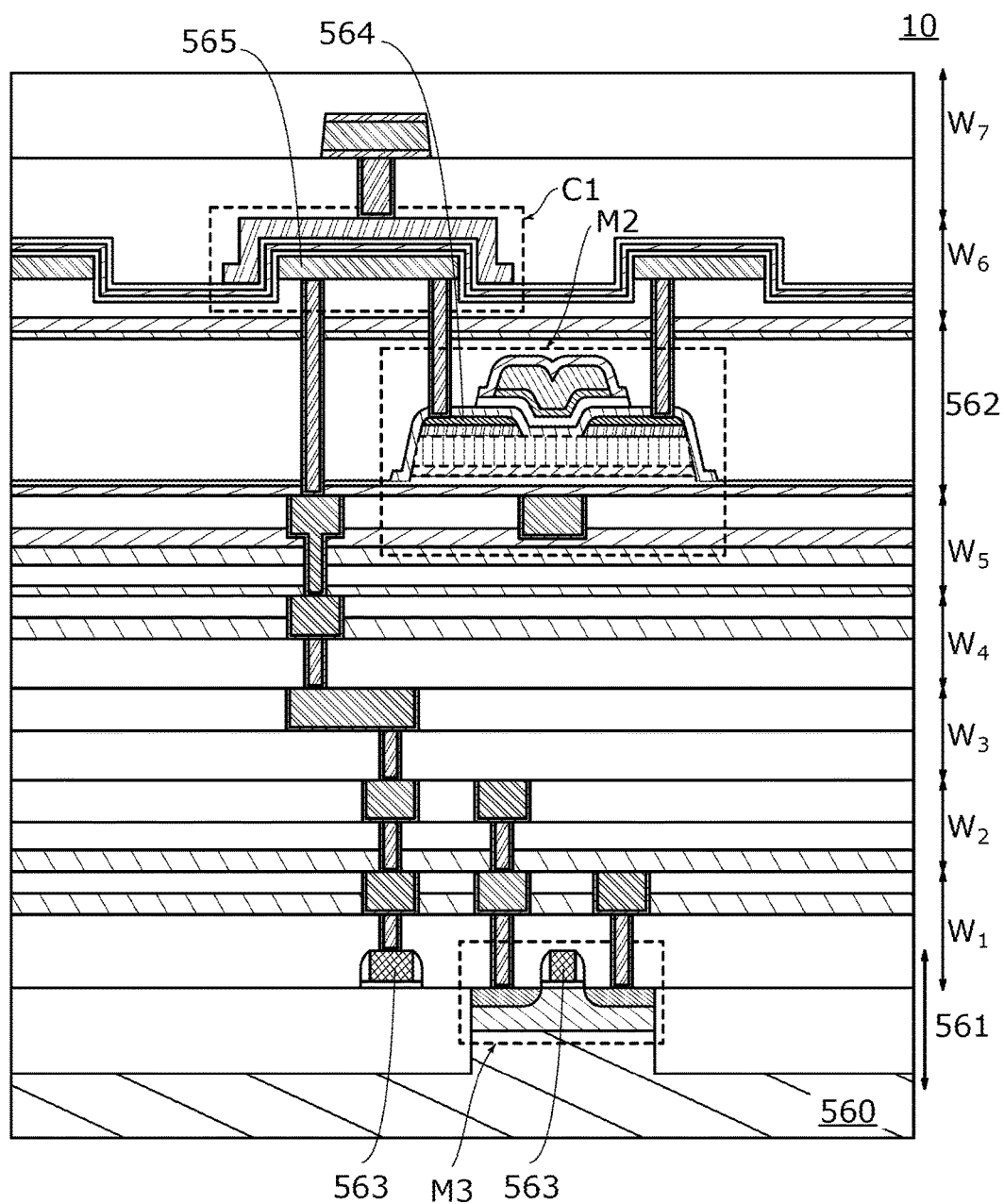
FIG. 25 illustrates a cross-sectional structure of a semiconductor device.

FIG. 25 illustrates an example of a stacked-layer structure of the transistors M2 and M3 and the capacitor C1 included in the first circuit 11.

The semiconductor device 10 includes a stack including a CMOS tier 561, wiring tiers $W_1$ to $W_5$, a transistor tier 562, and wiring tiers $W_6$ and $W_7$.

A transistor including silicon in a channel formation region is provided in the CMOS tier 561. An active layer of the transistor M3 is formed in a single crystalline silicon wafer 560. A gate (electrode 563) of the transistor M3 is electrically connected to the other of the source and the drain (electrode 564) of the transistor M2 and a second electrode 565 of the capacitor C1 through the wiring tiers $W_1$ to $W_5$.

The transistor M2 is provided in the transistor tier 562. In FIG. 25, a channel formation region of the transistor M2 includes a metal oxide. Note that in this embodiment, the transistor M2 includes its back gate electrode in the wiring tier $W_5$. The capacitor C1 is provided in the wiring tier $W_6$.

This embodiment can be implemented in appropriate combinations with any of the other embodiments.

(Embodiment 8)
[Oxide Semiconductor]

An oxide semiconductor of one embodiment of the present invention is described below.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor is InMZnO containing indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M, in some cases.

<Structure>

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in many cases. A pentagonal lattice arrangement, a heptagonal lattice arrangement, and the like are included in the distortion in some cases. Note that a clear crystal grain boundary cannot be observed even in the vicinity of distortion in the CAAC-OS. That is, a lattice arrangement is distorted so that formation of a crystal grain boundary is inhibited. This is probably because the CAAC-OS can tolerate distortion owing to a low density of arrangement of oxygen atoms in an a-b plane direction, a change in interatomic bond distance by substitution of a metal element, and the like.

The CAAC-OS tends to have a layered crystal structure (also referred to as a stacked-layer structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced by indium, the layer can also be referred to as an (In,M,Zn) layer. When indium of the In layer is replaced by the element M, the layer can also be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has low crystallinity as compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

The CAAC-OS is an oxide semiconductor with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

[Transistor Including Oxide Semiconductor]

Next, the case where the above-described oxide semiconductor is used for a transistor will be described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with a low carrier density is preferably used for the transistor. In order to reduce the carrier density of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. For example, an oxide semiconductor whose carrier density is lower than $8\times10^{11}/cm^3$, preferably lower than $1\times10^{11}/cm^3$, further preferably lower than $1\times10^{10}/cm^3$, and higher than or equal to $1\times10^{-9}/cm^3$ is used.

A highly purified intrinsic or substantially highly purified intrinsic oxide semiconductor film has a low density of defect states and accordingly has a low density of trap states in some cases.

Charge trapped by the trap states in the oxide semiconductor takes a long time to be released and may behave like fixed charge. Thus, a transistor whose channel region is formed in an oxide semiconductor having a high density of trap states has unstable electrical characteristics in some cases.

In order to obtain stable electrical characteristics of the transistor, it is effective to reduce the concentration of impurities in the oxide semiconductor. In addition, in order to reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

<Impurities>

Here, the influence of impurities in the oxide semiconductor is described.

When silicon or carbon that is one of Group 14 elements is contained in the oxide semiconductor, defect states are formed. Thus, the concentration of silicon or carbon in the oxide semiconductor and around an interface with the oxide semiconductor (measured by secondary ion mass spectrometry (SIMS)) is set lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated, in some cases. Thus, a transistor including an oxide semiconductor that contains alkali metal or alkaline earth metal is likely to be normally on. Therefore, it is preferable to reduce the concentration of alkali metal or alkaline earth metal in the oxide semiconductor. Specifically, the concentration of alkali metal or alkaline earth metal in the oxide semiconductor measured by SIMS is set lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally on. For this reason, nitrogen in the oxide semiconductor is preferably reduced as much as possible; for example, the concentration of nitrogen in the oxide semiconductor, which is measured by SIMS, can be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally on. Accordingly, it is preferable that hydrogen in the oxide semiconductor be reduced as much as possible. Specifically, the hydrogen concentration of the oxide semiconductor measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with a sufficiently reduced impurity concentration is used for a channel region in a transistor, the transistor can have stable electrical characteristics.

<Band Diagram>

Next, the case where the oxide semiconductor has a two-layer structure or a three-layer structure is described. A band diagram of a stacked-layer structure of an oxide semiconductor S1, an oxide semiconductor S2, and an oxide semiconductor S3 and insulators that are in contact with the stacked-layer structure, a band diagram of a stacked-layer structure of the oxide semiconductors S2 and S3 and insulators that are in contact with the stacked-layer structure, and a band diagram of a stacked-layer structure of the oxide semiconductors S1 and S2 and insulators that are in contact with the stacked-layer structure are described with reference to FIGS. 24A to 24C.

Figure 24A:
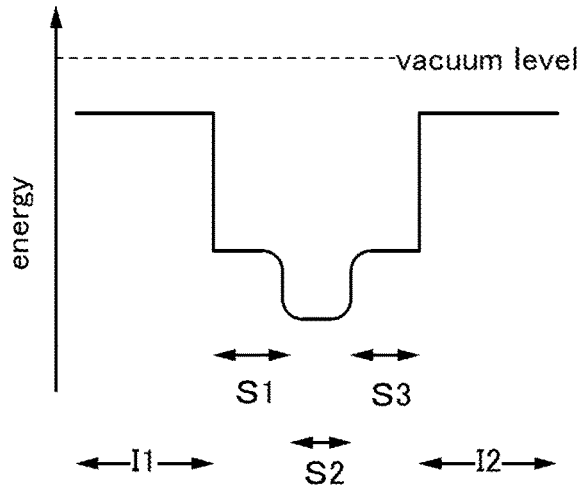
FIGS. 24A to 24C are schematic diagrams of energy band structures.
Figure 24B:
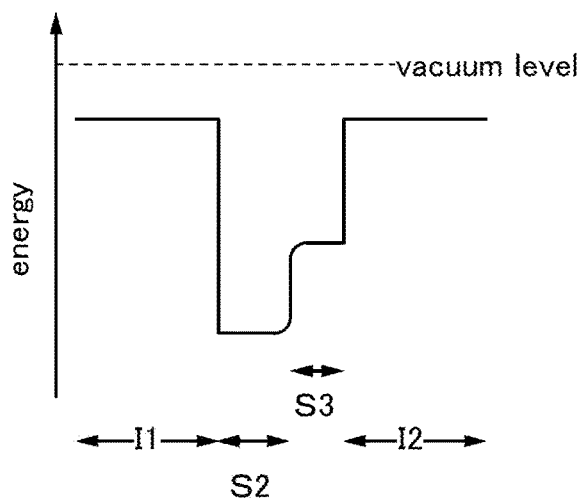
Figure 24C:
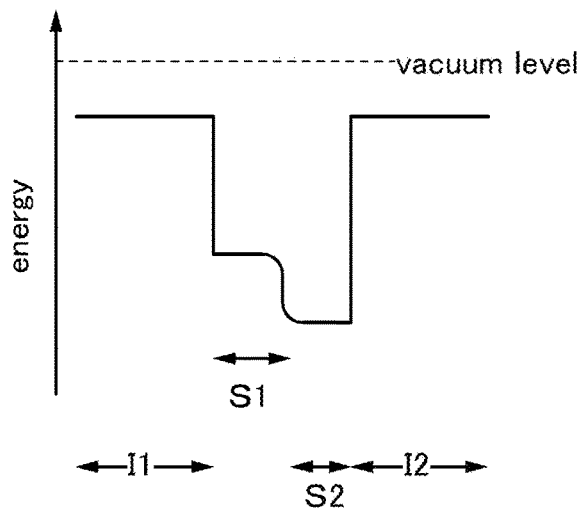

FIG. 24A is an example of a band diagram of a stacked-layer structure including an insulator I1, the oxide semiconductor S1, the oxide semiconductor S2, the oxide semiconductor S3, and an insulator I2 in a thickness direction. FIG. 24B is an example of a band diagram of a stacked-layer structure including the insulator I1, the oxide semiconductor S2, the oxide semiconductor S3, and the insulator I2 in a thickness direction. FIG. 24C is an example of a band diagram of a stacked-layer structure including the insulator I1, the oxide semiconductor S1, the oxide semiconductor S2, and the insulator I2 in a thickness direction. Note that for easy understanding, the band diagrams show the conduction band minimum (Ec) of each of the insulator I1, the oxide semiconductor S1, the oxide semiconductor S2, the oxide semiconductor S3, and the insulator I2.

The conduction band minimum of each of the oxide semiconductors S1 and S3 is closer to the vacuum level than that of the oxide semiconductor S2. Typically, a difference in the conduction band minimum between the oxide semiconductor S2 and each of the oxide semiconductors S1 and S3 is preferably greater than or equal to 0.15 eV or greater than or equal to 0.5 eV, and less than or equal to 2 eV or less than or equal to 1 eV. That is, it is preferable that the difference between the electron affinity of each of the oxide semiconductors S1 and S3 and the electron affinity of the oxide semiconductor S2 be greater than or equal to 0.15 eV or greater than or equal to 0.5 eV, and less than or equal to 2 eV or less than or equal to 1 eV.

As shown in FIGS. 24A to 24C, the conduction band minimum of each of the oxide semiconductors S1 to S3 is gradually varied. In other words, the conduction band minimum is continuously varied or continuously connected. In order to obtain such a band diagram, the density of defect states in a mixed layer formed at the interface between the oxide semiconductors S1 and S2 or the interface between the oxide semiconductors S2 and S3 is preferably made low.

Specifically, when the oxide semiconductors S1 and S2 or the oxide semiconductors S2 and S3 contain the same element (as a main component) in addition to oxygen, a mixed layer with a low density of defect states can be formed. For example, in the case where the oxide semiconductor S2 is an In—Ga—Zn oxide semiconductor, it is preferable to use an In—Ga—Zn oxide semiconductor, a Ga—Zn oxide semiconductor, gallium oxide, or the like as each of the oxide semiconductors S1 and S3.

At this time, the oxide semiconductor S2 serves as a main carrier path. Since the density of defect states at the interface between the oxide semiconductors S1 and S2 and the interface between the oxide semiconductors S2 and S3 can be made low, the influence of interface scattering on carrier conduction is small, and large on-state current can be obtained.

When an electron is trapped in a trap state, the trapped electron behaves like fixed charge; thus, the threshold voltage of the transistor is shifted in a positive direction. The oxide semiconductors S1 and S3 can make the trap state apart from the oxide semiconductor S2. This structure can prevent the positive shift of the threshold voltage of the transistor.

A material whose conductivity is sufficiently lower than that of the oxide semiconductor S2 is used for the oxide semiconductors S1 and S3. In that case, the oxide semiconductor S2, the interface between the oxide semiconductors S1 and S2, and the interface between the oxide semiconductors S2 and S3 mainly function as a channel region.

This embodiment can be implemented in appropriate combinations with any of the other embodiments.

(Embodiment 9)

Figure 26:
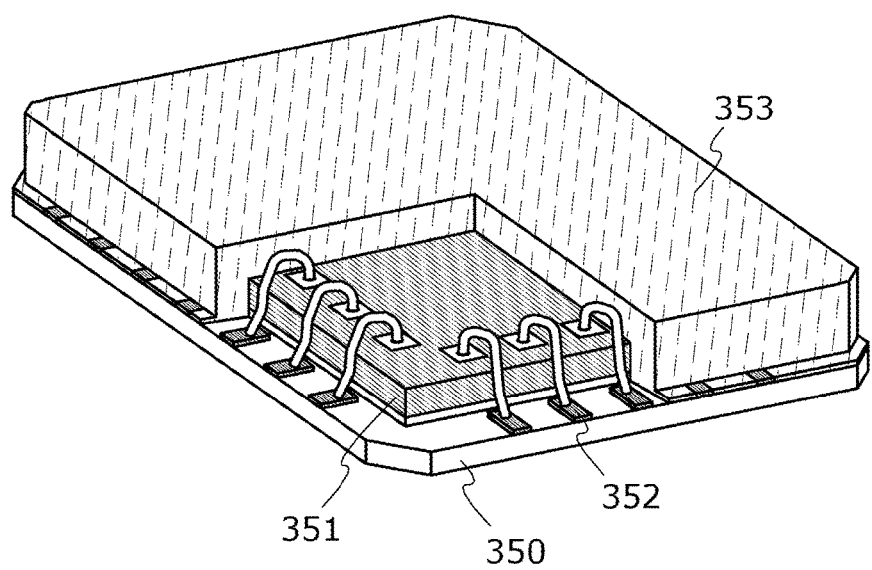
FIG. 26 illustrates a chip.

FIG. 26 is a perspective view illustrating a cross-sectional structure of a package using a lead frame interposer.

In the package in FIG. 26, a chip 351 corresponding to the semiconductor device of one embodiment of the present invention is connected to terminals 352 over an interposer 350 by wire bonding. The terminals 352 are placed on a surface of the interposer 350 on which the chip 351 is mounted. The chip 351 can be sealed by a mold resin 353 in which case the chip 351 is sealed so that part of each of the terminals 352 is exposed.

Figure 27:
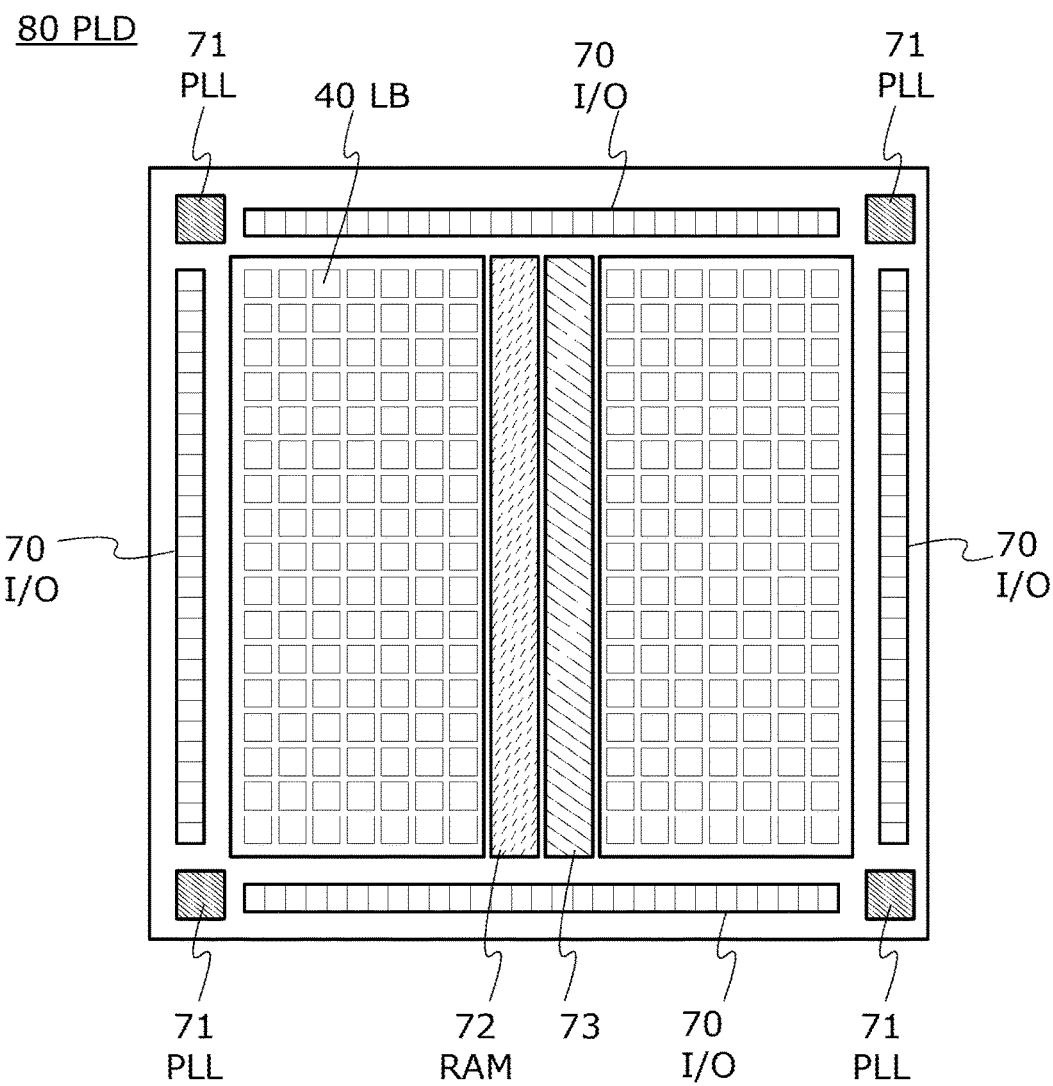
FIG. 27 illustrates a structure of a PLD.

FIG. 27 illustrates a configuration example of a programmable logic device (PLD) including the PLL of one embodiment of the present invention. A PLD 80 illustrated in FIG. 27 includes logic blocks (LB) 40, I/Os 70, PLLs 71, a RAM 72, and a data comparison circuit 73. The PLL 21 illustrated in FIG. 13 can be used as each of the PLLs 71, in which case the power consumption of the PLD 80 can be reduced.

This embodiment can be implemented in appropriate combinations with any of the other embodiments.

(Embodiment 10)

A semiconductor device of one embodiment of the present invention can be used for display devices, personal computers, or image reproducing devices provided with recording media (typically, devices that reproduce the content of recording media such as digital versatile discs (DVDs) and have displays for displaying the reproduced images). Other than the above, as an electronic device which can be provided with the semiconductor device of one embodiment of the present invention, mobile phones, game machines (including portable game machines), portable information terminals, e-book readers, cameras such as video cameras and digital still cameras, goggle-type displays (head mounted displays), navigation systems, audio reproducing devices (e.g., car audio units and digital audio players), copiers, facsimiles, printers, multifunction printers, automated teller machines (ATM), vending machines, medical equipment, and the like can be given. FIGS. 28A to 28F illustrate specific examples of these electronic devices.

FIG. 28A illustrates a portable game machine, which includes a housing 5001, a housing 5002, a display portion 5003, a display portion 5004, a microphone 5005, speakers 5006, an operation key 5007, a stylus 5008, and the like. The semiconductor device of one embodiment of the present invention can be used for a variety of integrated circuits included in the portable game machine. Note that although the portable game machine illustrated in FIG. 28A has the two display portions 5003 and 5004, the number of display portions included in the portable game machine is not limited to two.

FIG. 28B illustrates a notebook personal computer, which includes a housing 5401, a display portion 5402, a keyboard 5403, a pointing device 5404, and the like. The semiconductor device of one embodiment of the present invention can be used for a variety of integrated circuits included in the notebook personal computer.

FIG. 28C illustrates a display device, which includes a housing 5301, a display portion 5302, a supporting base 5303, and the like. Note that the display device includes all display devices for displaying information, such as display devices for personal computers, display devices for receiving TV broadcasts, and display devices for displaying advertisements. The semiconductor device of one embodiment of the present invention can be used for a variety of integrated circuits of the display device.

FIG. 28D illustrates a video camera, which includes a first housing 5801, a second housing 5802, a display portion 5803, operation keys 5804, a lens 5805, a joint 5806, and the like. The semiconductor device of one embodiment of the present invention can be used for a variety of integrated circuits included in the video camera. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

FIG. 28E illustrates a display device, which includes a housing 5701 having a curved surface, a display portion 5702, and the like. When a flexible substrate is used for the semiconductor device of one embodiment of the present invention, it is possible to use the semiconductor device for a variety of integrated circuits supported by the housing 5701 having a curved surface. It is thus possible to provide a user-friendly display device that is flexible and lightweight.

FIG. 28F illustrates a mobile phone, which includes a display portion 5902, a microphone 5907, a speaker 5904, a camera 5903, an external connection portion 5906, and an operation button 5905 in a housing 5901 with a curved surface. The semiconductor device of one embodiment of the present invention can be used for a variety of integrated circuits for controlling operation of the display device used as the display portion 5902.

This embodiment can be implemented in appropriate combinations with any of the other embodiments.

This application is based on Japanese Patent Application serial no. 2016-096700 filed with Japan Patent Office on May 13, 2016, the entire contents of which are hereby incorporated by reference.

What is claimed is:

1. A semiconductor device comprising:
a first circuit comprising a first transistor, a second transistor, a third transistor, a first capacitor, and a second capacitor; and
a second circuit comprising an input terminal and an output terminal,
wherein the first circuit is configured to hold a first potential and to control a level of a third potential supplied to the second circuit according to a second potential based on the first potential,
wherein the second circuit is configured to output a second signal from the output terminal based on a first signal input to the input terminal,
wherein one of a source and a drain of the first transistor is electrically connected to one of a source and a drain of the second transistor and one electrode of the first capacitor,
wherein the other of the source and the drain of the second transistor is electrically connected to a gate of the third transistor and one electrode of the second capacitor, and
wherein one of a source and a drain of the third transistor is electrically connected to the second circuit.

2. The semiconductor device according to claim 1, wherein a delay time from input of the first signal to the second circuit to output of the second signal from the second circuit is determined by the third potential.

3. The semiconductor device according to claim 1, wherein the other of the source and the drain of the first transistor is electrically connected to a first wiring,
wherein a gate of the first transistor is electrically connected to a second wiring,
wherein a gate of the second transistor is electrically connected to a third wiring, and
wherein the other of the source and the drain of the third transistor is electrically connected to a fourth wiring.

4. The semiconductor device according to claim 1, wherein a channel formation region of the first transistor, the second transistor, and the third transistor comprises an oxide semiconductor.

5. The semiconductor device according to claim 1, wherein the second circuit comprises an inverter.

6. The semiconductor device according to claim 1,
wherein the second circuit comprises an inverter comprising a p-channel transistor, and
wherein one of a source and a drain of the p-channel transistor is electrically connected to the one of the source and the drain of the third transistor.

7. A oscillator circuit comprising the semiconductor device according to claim 1.

8. A semiconductor device comprising:
a first circuit comprising a first transistor, a second transistor, a third transistor, a first capacitor, and a second capacitor; and
a second circuit comprising an input terminal and an output terminal,
wherein the first circuit is configured to hold a first potential and to supply a second potential based on the first potential to a gate of the third transistor,
wherein the second circuit is configured to output a second signal from the output terminal based on a first signal input to the input terminal,
wherein one of a source and a drain of the first transistor is electrically connected to one of a source and a drain of the second transistor and one electrode of the first capacitor,
wherein the other of the source and the drain of the second transistor is electrically connected to the gate of the third transistor and one electrode of the second capacitor, and
wherein one of a source and a drain of the third transistor is electrically connected to the output terminal of the second circuit.

9. The semiconductor device according to claim 8,
wherein the third transistor is configured to delay the second signal, and
wherein a delay time of the second signal is determined by the second potential.

10. The semiconductor device according to claim 8,
wherein the other of the source and the drain of the first transistor is electrically connected to a first wiring,
wherein a gate of the first transistor is electrically connected to a second wiring, and
wherein a gate of the second transistor is electrically connected to a third wiring.

11. The semiconductor device according to claim 8, wherein a channel formation region of the first transistor, the second transistor, and the third transistor comprises an oxide semiconductor.

12. The semiconductor device according to claim 8, wherein the second circuit comprises an inverter.

13. The semiconductor device according to claim 8,
wherein the second circuit comprises an inverter comprising a p-channel transistor and an n-channel transistor, and
wherein one of a source and a drain of the p-channel transistor and one of a source and a drain of the n-channel transistor are electrically connected to the one of the source and the drain of the third transistor.

14. An oscillator circuit comprising the semiconductor device according to claim 8.

* * * * *